United States Patent
Mazumdar et al.

(10) Patent No.: US 9,100,044 B2
(45) Date of Patent: Aug. 4, 2015

(54) METHOD AND APPARATUS FOR DIRECT DIGITAL SYNTHESIS OF SIGNALS USING TAYLOR SERIES EXPANSION

(71) Applicant: M.S. RAMAIAH SCHOOL OF ADVANCED STUDIES, Bangalore, Karnataka (IN)

(72) Inventors: Dipayan Mazumdar, Bangalore (IN); Govind Rangaswamy Kadambi, Bangalore (IN)

(73) Assignee: M.S. Ramaiah School of Advanced Studies

( * ) Notice: Subject to any disclaimer, the term of this patent is extended or adjusted under 35 U.S.C. 154(b) by 0 days.

(21) Appl. No.: 14/054,370

(22) Filed: Oct. 15, 2013

(65) Prior Publication Data

US 2014/0043179 A1    Feb. 13, 2014

Related U.S. Application Data

(63) Continuation of application No. 13/389,562, filed as application No. PCT/IB2010/054721 on Oct. 19, 2010, now Pat. No. 8,570,203.

(51) Int. Cl.
*H03M 9/00* (2006.01)
*H03M 1/66* (2006.01)
*G06F 1/035* (2006.01)

(52) U.S. Cl.
CPC ............. *H03M 1/66* (2013.01); *G06F 1/0356* (2013.01); *H03M 9/00* (2013.01)

(58) Field of Classification Search
USPC ............................ 341/101, 100, 147; 600/310
See application file for complete search history.

(56) References Cited

U.S. PATENT DOCUMENTS

| | | | |
|---|---|---|---|
| 3,551,826 A | 12/1970 | Sepe | |
| 3,582,810 A | 6/1971 | Gillette | |
| 3,654,450 A | 4/1972 | Webb | |
| 3,735,269 A | 5/1973 | Jackson | |
| 4,752,902 A | 6/1988 | Goldberg | |
| 4,905,177 A | 2/1990 | Weaver, Jr. et al. | |
| 4,951,004 A | 8/1990 | Sheffer et al. | |
| 4,958,310 A | 9/1990 | Goldberg | |
| 5,926,120 A * | 7/1999 | Swenson et al. | 341/100 |
| 6,456,672 B1 * | 9/2002 | Uchiki et al. | 375/344 |

(Continued)

FOREIGN PATENT DOCUMENTS

| | | |
|---|---|---|
| EP | 0443242 A2 | 8/1991 |
| EP | 1646142 A1 | 4/2006 |

OTHER PUBLICATIONS

J. Vankka et al.: "A direct digital synthesizer with an on-chip D/A-converter," IEEE Journal of Solid State Circuits, vol. 33, No. 2, pp. 218-227 (1998).

(Continued)

*Primary Examiner* — Brian Young
(74) *Attorney, Agent, or Firm* — Brundidge & Stanger, P.C.

(57) ABSTRACT

A method and apparatus for direct digital synthesis (DDS) of signals using Taylor series expansion is provided. The DDS may include a modified phase-to-amplitude converter that includes read-only-memories (ROMs), registers and, a single size, such as a coarse, intermediate, and fine ROM corresponding to respective higher resolution phase angles. The outputs of the ROMs when combined can form a digital output signal in the form of a Taylor series of a sinusoid function.

19 Claims, 17 Drawing Sheets

(56) References Cited

U.S. PATENT DOCUMENTS

| | | | |
|---|---|---|---|
| 6,587,862 B1 | 7/2003 | Henderson | |
| 6,732,128 B2 | 5/2004 | Kelly | |
| 6,853,247 B2 * | 2/2005 | Weldon | 330/149 |
| 7,580,007 B2 | 8/2009 | Brown et al. | |
| 7,599,977 B2 | 10/2009 | Ammar | |
| 7,701,260 B1 | 4/2010 | Old | |
| 8,582,674 B2 * | 11/2013 | Yu et al. | 375/260 |
| 2005/0262175 A1 | 11/2005 | Iino et al. | |
| 2008/0016141 A1 | 1/2008 | Bushman et al. | |

OTHER PUBLICATIONS

Jridi et al.: "Direct Digital Synthesizer with CORDIC Algorithm and Taylor Series Approximation for Digital Receivers," European Journal of Scientific Research, ISSN 145-212X, vol. 30, No. 4, (2009), pp. 542-553.

Bellaouar et al.: "Low-Power Direct Digital Frequency Synthesis for Wireless Communications," IEEE Journal of Solid-State Circuits, vol. 35, No. 3, Mar. 2000, pp. 385-390.

Vankka: "Direct Digital Synthesizers: Theory, Design and Applications," Thesis, Helsinki University of Technology, Department of Electrical and Communications Engineering, Electronic Circuit Design Laboratory, Nov. 2000.

Torosyan: "Direct Digital Frequency Synthesizers: Complete Analysis and Design Guidelines," Thesis, University of California, 2003.

Radhakrishnan: Low Power CMOS Pass Logic 4-2 Compressor for High-Speed Multiplication, Proc. 43rd IEEE Midwest Symp. om Circuits and Systems, Lansing MI, Aug. 8-11, 2000.

Brandon: "Direct Digital Systhesizers are Known for Their Highly Accurate Digital Tuning, Low Noise Figure, and Phase-Continuous Frequency-Hopping Capabilites, which Make Them More Attractive than Alternative Analog Frequency-Synthesis Solutions," DDS Design, www.edn.com, May 13, 2004, pp. 71-84.

Pothuri: "Design of Pulse Output Direct Digital Synthesizer with an Analog Filter Bank," Thesis, B. Tech., Jawaharal Nehru Technology University, 2005.

A Technical Tutorial on Digital Signal Synthesis, Analog Devices, Inc., 1999.

Love, Janine Sullivan: RF Front-End World Class Designs, "Chapter 9 RF/IF Circuits," copyright 2009, ISBN: 978-1-85617-622-4, pp. 259-267.

Cleveland: First-Order-Hold Interpolation Digital-to-Analog Converter with Application to Aircraft Simulation, Nasa Technical Note, NASA TN D-8331, Nov. 1976.

The free encyclopedia from Wikipedia, "Direct Digital Synthesizer," http://en.wikipedia.org/wiki/Direct_digital_synthesis, printed on Feb. 8, 2012.

The free encyclopedia from Wikipedia, "Cognitive Radio," http://en.wikipedia.org/wiki/Cognitive_radio, printed on Feb. 8, 2012.

International Search Report and Written Opinion prepared by the Australian Patent Office for PCT/IB2010/054721, completed Dec. 13, 2010.

\* cited by examiner

METHOD AND APPARATUS FOR DIRECT DIGITAL SYNTHESIS OF SIGNALS USING TAYLOR SERIES EXPANSION

CROSS-REFERENCE TO RELATED APPLICATIONS

This application is a continuation application of U.S. patent application No. 13/389,562, filed on Feb. 8, 2012, now U.S. Pat. No. 8,570,203, which is the National Stage filing under 35 U.S.C. § 371 of PCT Application Ser. No. PCT/IB2010/054721, filed on Oct. 19, 2010, which claims priority to Indian application no. 2489/CHE/2010, filed on Aug. 27, 2010, the entire disclosures of which are incorporated herein by reference.

BACKGROUND

Many communications and radar systems require radio frequency (RF) synthesizer performance, which often can be difficult to implement using direct frequency multiplication, phase-locked-loop (PLL), or direct digital synthesizer (DDS) techniques. To achieve characteristics of a desired frequency range, a high frequency output, a fine tuning resolution, a fast settling time, and a low phase noise, system designers often combine PLL and DDS technologies. The strengths of one technology join with strengths of the other technology to extend a possible range of performance.

As one example, a PLL, also known as Indirect synthesis, is a negative feedback loop structure that locks a phase of an output signal after division to a reference clock. Thus, the output signal of the PLL has a phase related to a phase of the input reference signal. For example, the PLL compares a phase of an input signal with a phase signal derived from its output oscillator signal and adjusts a frequency of its oscillator to keep the phases matched. A PLL may include a variable counter (divider) to allow generation of many frequencies by changing a division ratio.

As another example, DDS is a technique for using digital data processing blocks to generate a frequency and phase-tunable output signal referenced to a fixed frequency clock source. The reference clock frequency is divided down in a DDS architecture by a scaling factor set forth in a programmable binary tuning word. The tuning word is typically 24-48 bits long which enables a DDS implementation to provide high output frequency tuning resolution.

DDS technologies may be used to achieve fast switching (typically less than a microsecond), which can be important in spread-spectrum or frequency-hopping systems including radar and communication systems. Additional advantages of DDS technologies include fine tuning steps, low phase noise, transient-free (phase continuous) frequency changes, flexibility as a modulator, and small size, among others.

However, DDS systems may have an operating range that is limited by the Shannon, Nyquist sampling theory. For example, an output is typically limited to about 45% of a maximum clock rate at which the DDS can be operated. Another limitation of DDS systems may include spectral purity, which is governed by a density/complexity of the DDS circuitry that is attainable at a desired operating speed.

SUMMARY

In one aspect, an example system for outputting a sinusoid signal formed by using a Taylor series expansion is provided. The system comprises one or more memory elements. A first memory element stores values of a first component in the Taylor series expansion, a second memory element stores values that when combined with values stored in a third memory element represent a second component in the Taylor series expansion, and a fourth memory element stores values of a third component in the Taylor series expansion. The system also comprises a plurality of parallel to serial converters. One parallel to serial converter is coupled to each of the one or more memory elements, and the parallel to serial converters convert outputs of the memory elements to serial bitstreams for transmission. The system also comprises a plurality of serial to parallel converters receiving the serial bitstreams and converting the serial bitstreams into parallel bitstreams. The system also comprises an adder receiving the outputs of the first memory element, the second memory element, the third memory element, and the fourth memory element as parallel bitstreams from the plurality of serial to parallel converters, and adding the outputs in a manner to generate the first component, the second component and the third component of the Taylor series expansion and combining the first component, the second component and the third component to form a signal output. The system further comprises a digital-to-analog converter (DAC) receiving the signal output from the adder and converting the signal output to an analog output signal, and a low pass filter receiving the analog output signal from the DAC and providing a filtered analog output signal.

In another aspect, an example method of generating a Taylor series expansion of a sinusoid signal is provided. The method comprises receiving a phase angle value of a sinusoid that is in a binary form, and receiving a number of most significant bits and least significant bits of the binary form phase angle value as inputs at one or more memory elements. The method also comprises using the most significant bits and the least significant bits as memory address locations to retrieve (i) from a first memory element a value of a first component in the Taylor series expansion, (ii) from a second memory element a value that when combined with a value retrieved from a third memory element represent a second component in the Taylor series expansion, and (iii) from a fourth memory element a value of a third component in the Taylor series expansion. The method further comprises converting outputs of the one or more memory elements to serial bitstreams for transmission, and converting the serial bitstreams into parallel bitstreams for processing. The method also comprises combining the parallel bitstreams in a manner to generate the first component, the second component and the third component of the Taylor series expansion, and converting the first component, the second component and the third component of the Taylor series expansion to an analog output signal.

In another aspect, an example computer readable medium having stored therein instructions executable by a computing device to cause the computing device to perform functions is provided. The functions comprise receiving a phase angle value of a sinusoid that is in a binary form. The functions also comprise using a number of most significant bits and least significant bits of the binary form phase angle value as memory address locations to retrieve (i) from a first memory element a value of a first component in the Taylor series expansion, (ii) from a second memory element a value that when combined with a value retrieved from a third memory element represent a second component in the Taylor series expansion, and (iii) from a fourth memory element a value of a third component in the Taylor series expansion. The functions also comprise converting outputs of the one or more memory elements to serial bitstreams for transmission, and converting the serial bitstreams into parallel bitstreams for processing. The functions further comprise combining the parallel bitstreams in a manner to generate the first component, the second component and the third component of the Taylor series expansion, and converting the first component, the second component and the third component of the Taylor series expansion to an analog output signal.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
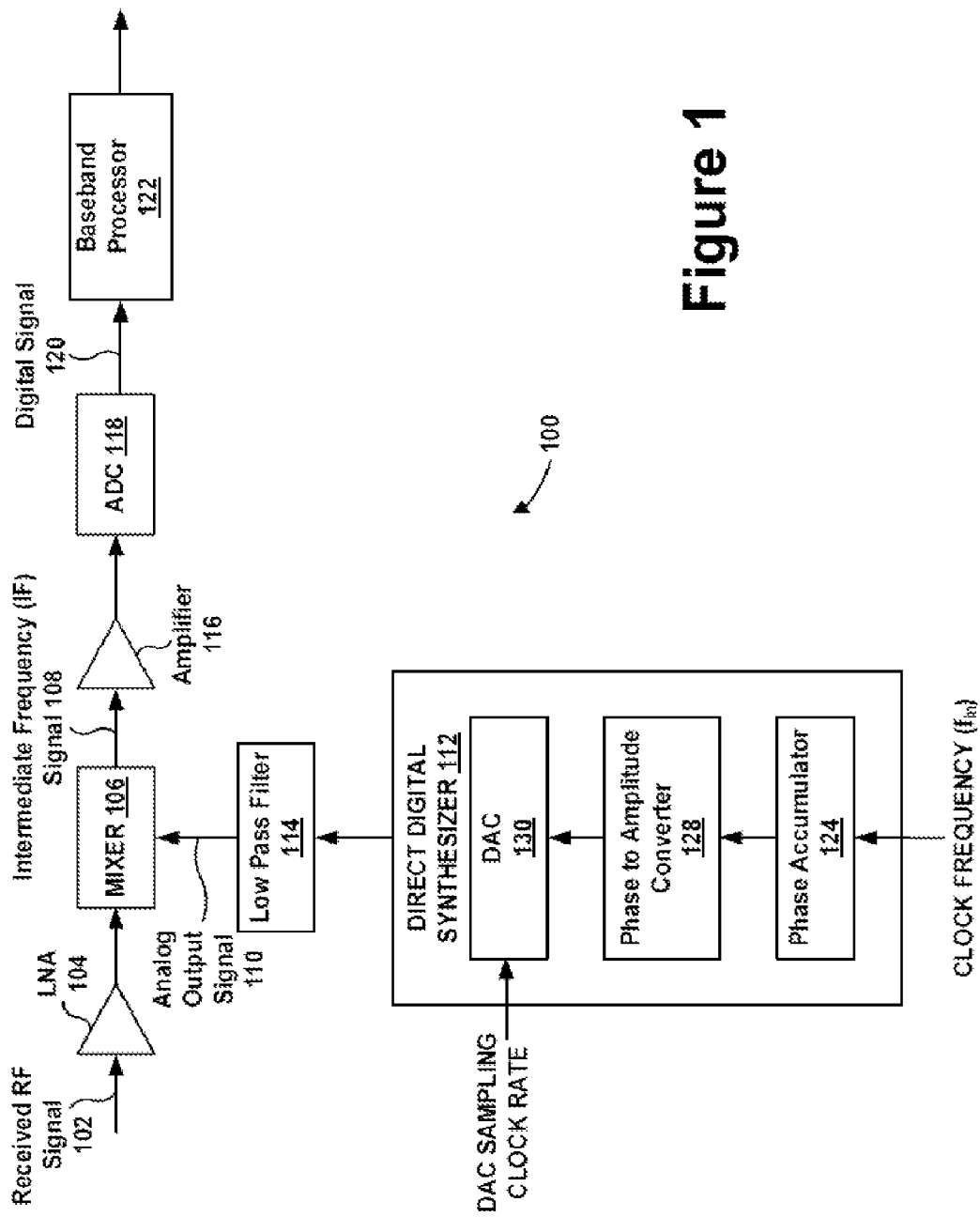
FIG. 1 illustrates a block diagram of an example radio frequency (RF) receiver.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Example embodiments below describe a direct digital synthesizer (DDS) for generation of sinusoidal waveforms. The DDS may reduce a path delay involved in converting phase values into amplitude values. In one aspect, example embodiments include a modified phase-to-amplitude converter of the DDS that includes 4 read-only-memories (ROMs), 4 registers and, a single 4-input adder. Since the DDS includes a 4-input adder (instead of a multiplier and two adders), a path delay associated with the DDS may be about 20 times lower than a path delay in a conventional DDS for 0.18 um process technology and even further at lower geometries, for example. A maximum input clock frequency can be increased by about 20 times to increase a maximum achievable output frequency at an output of the DDS. Thus, throughput can be increased due to reduction in the path delay, and power consumption and area overhead can be reduced due to removal of the multiplier.

Referring now to the Figures, FIG. 1 illustrates a block diagram of an example radio frequency (RF) receiver 100. The RF receiver receives an RF signal 102 at an antenna (not shown), and passes the RF signal 102 to a low noise amplifier (LNA) 104 to amplify the signal. The LNA 104 outputs to an RF mixer 106 to generate an intermediate frequency signal 108. In one embodiment, the intermediate frequency signal 108 is generated by mixing the received RF signal 102 with an analog output signal 110 supplied by a direct digital synthesizer 112 via a low pass filter 114.

The intermediate frequency signal 108 is forwarded to an amplifier 116 to amplify the intermediate frequency signal 108 and then to an analog-to-digital converter (ADC) 118 to convert the intermediate frequency signal 108 to a digital signal 120. The digital signal 120 is provided to a baseband processing module 122 for further processing.

The DDS 112 generates the analog output signal 110 using a phase accumulator 124, a phase to amplitude converter 128, and a digital-to-analog converter (DAC) 130. In one example, the phase accumulator 124 generates digital waveforms by incrementing a phase counter based on a received clock frequency ($f_{in}$). The phase to amplitude converter 128 receives the digital phase waveforms and looks up corresponding phase values in memory, and creates waveform sample values at any desired phase offset provided by the phase accumulator 124. The phase to amplitude converter 128 outputs a set of waveform sample values to the DAC 130. Thus, the phase to amplitude converter 128 uses a lookup table (in memory, for example) to convert the digital waveforms of the phase accumulator's 124 instantaneous output value into sinewave amplitude information that is presented to the DAC 130. The DAC 130 converts the set of waveform sample values into an analog output signal based on a DAC sampling clock rate that can be maintained higher than about two times a maximum desired sinusoid output frequency, for example. As shown, the output of the DAC 130 is subsequently filtered by the low pass filter 114 to remove aliasing and DAC artifacts or glitches, for example. In one example, the DAC output can be filtered by a surface acoustic wave (SAW) filter to provide other stopband attenuation.

Although, the above-description describes implementation of the DDS 112 in an RF receiver, the DDS 112 can also be used in other applications such as orthogonal frequency direct modulation (OFDM) transmitters, biomedical instruments for ultrasound, VLSI chip testing for mixed signal chips in wireless and wire-line communication, etc. It should be further understood that this and other arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

Figure 2:
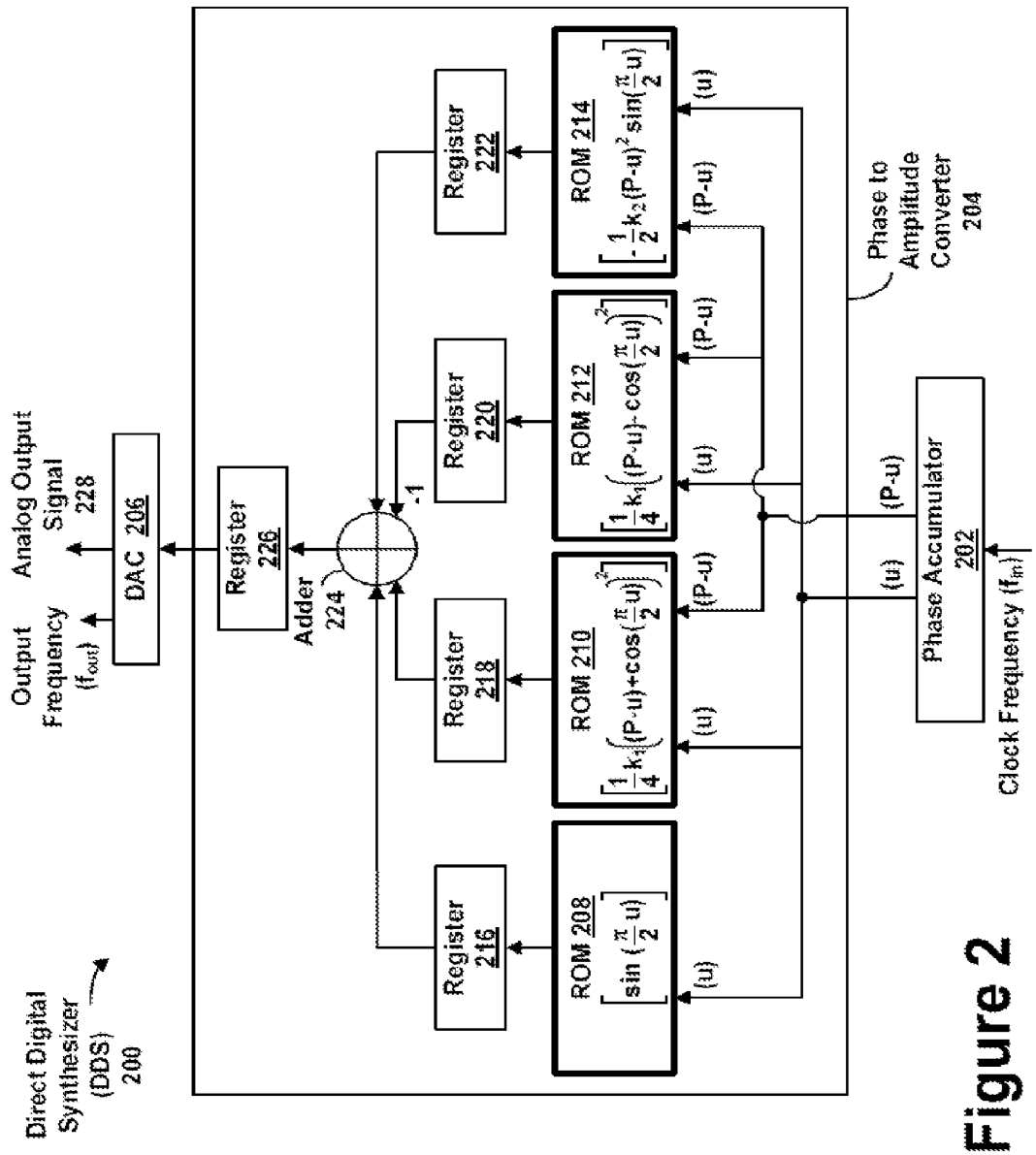
FIG. 2 illustrates a block diagram of an example embodiment of a direct digital synthesizer (DDS).

FIG. 2 illustrates a block diagram of an example embodiment of a direct digital synthesizer (DDS) 200. The DDS 200 includes a phase accumulator 202, a phase-to-amplitude converter 204, and a digital-to-analog converter (DAC) 206. The output of the DDS 200 may be a Taylor series expansion of $$\sin\left(\frac{\pi}{2}u\right).$$

Any of the components of the DDS 200, or portions of components of the DDS 200, may be in the form of digital logic components, integrated circuitry, or functions of the components or portions of the components may be performed by a processor executing a program, for example. Thus, functions of the components may be represented by software programs stored on computer readable medium, for example.

The phase accumulator 202 generates digital waveforms by incrementing a phase counter based on an external clock frequency ($f_{in}$). In one example, the phase accumulator 202 is a counter that generates a phase angle value of a sinusoid. For example, the phase accumulator 202 may generate a phase angle value through a digital counter which can be 24 bits, 28 bits, 32 bits, 64 bits, etc. The greater a number of bits results in larger phase address and smaller phase step possibilities. An output of the phase accumulator 202 may in mathematical terms always between 0 and 2π, for example. In an example implementation, the output of the phase accumulator 202 is 16 bits, and the output is divided into upper bits (u) (e.g., or most significant bits) and lower bits (P-u) (e.g., or least significant bits). In one example implementation, (u) is 12 bits and (P-u) is 4 bits, however, other example implementations are possible as well. A minimum phase step is determined by the lowermost bits (P-u), for example. A phase of a sinusoidal signal varies between 0 and 2π and the phase angle corresponding to a phase accumulator output count of C can be written as $$\phi = \frac{1}{2\pi} * (\text{Phase counter output}).$$

In one example, the phase counter output range can be as about 0 to about 255, or in other examples the range may be about 0 to about 16383.

The phase accumulator 202 outputs the digital waveforms in binary form to the phase-to-amplitude converter 204. The phase-to-amplitude converter 204 includes read only memory (ROMs) 208-214, registers 216-222, a 4-input adder 224, and a register 226.

In one example, the ROMs 208-214 are configured to receive most significant bits (u) and least significant bits (P-u) as inputs from the phase accumulator 202. Thus, the ROMs 208-214 receive two inputs from the phase accumulator 202. Alternatively, the ROMs 208-214 may receive the output from the phase accumulator 202, and divide the output into (u) and (P-u). The most significant bits (u) and least significant bits (P-u) are used to look up phase values in the ROMs 208-214 so as to create waveform sample values at any desired phase offset as dictated by the phase accumulator 202.

Using an example 16-bit phase accumulator output, which corresponds to 65536 samples per cycle of a ROM, the most significant bits (u) may be the most significant 12 bits, and the least significant bits (P-u) may be the remaining 4 bits. A value of P may be selected based on a width of a ROM. In one example, for a minimum error, a proportion of lower bits can be about a fourth of the total number of bits. Thus, for a 16-bit address, upper bits may be the first 12-13 bits, and lower bits may be the remaining 3-4 bits. A width of a largest size ROM may determine a number of bits to use for the upper bits, and widths of smaller sized ROMs may determine a number of bits to use for the lower bits.

The (u) bits may form a row address and the (P-u) bits may form a column address in a ROM. The (u) and (P-u) bits may be received at address ports of all the ROMs 208-214 for addressing contents of the ROMs 208-214, and each ROM 208-214 also includes one or more data ports for reading data out of the ROMs 208-214, for example. Alternatively, as shown in FIG. 2, lower bits may not be sent to the ROM 208, which may be a larger sized ROM and may only need the upper bits for addressing. Other examples are possible as well.

Each of the ROMs 208-214 may produce one component of a sinusoid, and each of the ROMs 208-214 may be of a different size. For example, the ROM 208 may be a coarse ROM corresponding to a phase angle of greater absolute magnitude, the ROMs 210 and 212 may be intermediate ROMs corresponding to an intermediate phase angle, and the ROM 214 may be a fine ROM corresponding to a small phase angle. Other ROM sizes or division of the ROMs is possible as well. Using ROMs of different storage sizes enables the coarse ROM to have about 1024 entries, and the intermediate ROM to have about 16 entries, and the fine ROM to have only about 8 entries, for example. The finer ROMs store values corresponding to smaller angles and require lower output bit-width, for example. Other sizes of ROMs are possible as well.

The coarse ROM 208 may have a resolution of about 11 bits, the coarse ROMs 210 and 212 may have a resolution of about 9 bits, and the fine ROM 214 may have a resolution of about 3 bits, for example. Using this example configuration may achieve a spurious-free dynamic range (SFDR) of the DDS 200 that complies with the theoretical signal-to-noise ratio (SNR) of an N-bit ADC or DAC of 6.02(N)+1.76=SNR. For example, with 16 bit outputs from the phase accumulator 202, the SFDR may be a minimum of 6.02(16)+1.76=98.08 dB or better.

The outputs of the ROMs 208-214 when combined can form a digital output signal in the form of a Taylor series expansion of a sinusoid function. Although the description below details embodiment of the DDS 200 outputting a Taylor series expansion form of a sinusoid function, the DDS 200 may output other forms or sinusoid function, or still other functions as well.

As one example, a Taylor series expansion of a function is:

$$f(x) = f(a) + f'(a)\frac{(x-a)}{1!} + f''(a)\frac{(x-a)^2}{2!} + \dots \quad \text{Equation (1)}$$

Thus, the Taylor series expansion of $$\sin\left(\frac{\pi}{2}u\right)$$

is below:

$$\sin\left(\frac{\pi}{2}P\right) = \sin\left(\frac{\pi}{2}u\right) + k_1(P-u)\cos\left(\frac{\pi}{2}u\right) - \frac{1}{2}k_2(P-u)^2\sin\left(\frac{\pi}{2}u\right) \quad \text{Equation (2)}$$

where k1 and k2 are constants that can be estimated by interpolation. For example, using the values above for an angle of $$\frac{\pi}{2},$$

$k_1$ is approximately 1.57 an $k_2$ is approximately −2.46, for example.

The second term of Equation (2) including the multiplication of $$k_1(P-u)\cos\left(\frac{\pi}{2}u\right)$$

can be replaced by the addition of two terms $$\frac{1}{4}k_1\left((P-u) + \cos\left(\frac{\pi}{2}u\right)\right)^2$$

and $$\frac{1}{4}k_1\left((P-u) - \cos\left(\frac{\pi}{2}u\right)\right)^2$$

according to the following algebraic relationship:

$$xy = \frac{(x+y)^2}{4} - \frac{(x-y)^2}{4} \quad \text{Equation (3)}$$

Thus, Equation (2) above can be rewritten as:

$$\sin\left(\frac{\pi}{2}u\right) + \frac{1}{4}k_1\left((P-u) + \cos\left(\frac{\pi}{2}u\right)\right)^2 - \quad \text{Equation (4)}$$
$$\frac{1}{4}k_1\left((P-u) - \cos\left(\frac{\pi}{2}u\right)\right)^2 - \frac{1}{2}k_2(P-u)^2\sin\left(\frac{\pi}{2}u\right)$$

Each ROM 208-214 may include values (fixed point or floating point values) according to the equations shown below so that one of each ROM includes values for each term of Equation (4). For example, values of ROM 208 may correspond to:

$$\sin\left(\frac{\pi}{2}\right)u \quad \text{Equation (5)}$$

Values of ROM 210 may correspond to:

$$\frac{1}{4}k_1\left((P-u) + \cos\left(\frac{\pi}{2}u\right)\right)^2 \quad \text{Equation (6)}$$

Values of ROM 212 may correspond to:

$$\frac{1}{4}k_1\left((P-u) - \cos\left(\frac{\pi}{2}u\right)\right)^2 \quad \text{Equation (7)}$$

Values of ROM 210 may correspond to:

$$-\frac{k_2(P-u)^2}{2}\sin\left(\frac{\pi}{2}u\right) \quad \text{Equation (8)}$$

A derivation of terms in Equation (2) follows.

In exemplary embodiments, using this configuration of a Taylor series expansion replaces multiplication of terms using values stored in 2 ROMs (e.g., ROMs 210 and 212) and performing a shift. For example, the division by four in Equation (3) above can be written as a shift by 2 to the right using a register. Thus, Equation (3) can be represented as:

$$\frac{(x+y)^2}{4} - \frac{(x-y)^2}{4} = \{(x+y)^2 >> 2 - (x-y)^2 >> 2\} \quad \text{Equation (9)}$$

where >>2 is a shift to the right by 2. Thus, in one embodiment, instead of a ROM supplying "x" and "y", the ROM can supply values for "(x+y)²" and "(x−y)²", for example, with outputs being shifted by 2 to the right to result in the values shown in Equations (6)-(7), for example.

As an alternate derivation to illustrate examples for determining values stored in ROMs 208-214, which when combined form a Taylor series expansion of a sinusoid signal, consider:

$$\sin\left(\frac{\pi}{2}P\right) = \sin\left(\frac{\pi}{2}(u + P - u)\right) \quad \text{Equation (10)}$$

Using the expression, sin(A+B)=sin A cos B+cos A sin B, where $$A = \left(\frac{\pi}{2}u\right)$$

and $$B = \left(\frac{\pi}{2}(P-u)\right),$$

Equation (10) becomes:

$$\sin\left(\frac{\pi}{2}u\right)\cos\left(\frac{\pi}{2}(P-u)\right) + \cos\left(\frac{\pi}{2}u\right)\sin\left(\frac{\pi}{2}(P-u)\right) \quad \text{Equation (11)}$$

Using the Taylor series expansion of $$\sin(z) = z - \frac{z^3}{3!} + \ldots$$

and $$\cos(z) = 1 - \frac{z^2}{2!} - \frac{z^4}{4!} + \ldots,$$

and substituting in the Taylor series expansion of the second term of each component of Equation (11) (e.g., of the terms $$\cos\left(\frac{\pi}{2}(P-u)\right)$$

and $$\sin\left(\frac{\pi}{2}(P-u)\right))$$

results in:

$$\sin\left(\frac{\pi}{2}u\right)\left(1 - \frac{\left[\frac{\pi}{2}(P-u)\right]^2}{2}\right) + \cos\left(\frac{\pi}{2}u\right)\left(\frac{\pi}{2}(P-u) - \frac{\left[\frac{\pi}{2}(P-u)\right]^3}{6}\right) \quad \text{Equation (12)}$$

Neglecting all terms in Equation (12) above the second order results in:

$$\sin\left(\frac{\pi}{2}u\right) - \sin\left(\frac{\pi}{2}u\right)\frac{\left[\frac{\pi}{2}(P-u)\right]^2}{2} + \cos\left(\frac{\pi}{2}u\right)\left[\frac{\pi}{2}(P-u)\right] \quad \text{Equation (13)}$$

Rearranging the terms of Equation (13) results in:

$$\sin\left(\frac{\pi}{2}u\right) + \cos\left(\frac{\pi}{2}u\right)\left[\frac{\pi}{2}(P-u)\right] - \sin\left(\frac{\pi}{2}u\right)\frac{\left[\frac{\pi}{2}(P-u)\right]^2}{2} \quad \text{Equation (14)}$$

Equation (14) is equivalent to Equation (2) above, where $$k_1 = \frac{\pi}{2}$$

or about 1.57, and $$k_2 = \left(\frac{\pi}{2}\right)^2,$$

or about 2.46, as described above, for example. The constants k1 and k2 may be used to convert radian angle arguments for the multiplication, for example.

Each ROM has respective output registers 216-222. The registers 216-222 are buffers so as to provide outputs of the ROMs 208-214 to the adder 224 at about the same time. If the ROMs 208-214 drove the adder 224, the coarse ROM 208 and the fine ROM 214 may not output at the same time resulting in unequal delay times. The registers 216-222 help ensure that an overall delay between an output of the registers 216-222 is stable and independent of placement of the ROMs, for example, so that ROM access time is uniform among the ROMs 208-214.

Bit-widths of the registers 216-222 may be matched to the respective ROMs. Outputs of the registers 216-222 are fed to the 4-input adder 224 that adds the waveform values. An output of the 4-input adder 224 is given by:

$$\sin\left(\frac{\pi}{2}u\right) + \frac{1}{4}k_1\left((P-u) + \cos\left(\frac{\pi}{2}u\right)\right)^2 - \frac{1}{4}k_1\left((P-u) - \cos\left(\frac{\pi}{2}u\right)\right)^2 - \frac{1}{2}k_2(P-u)^2\sin\left(\frac{\pi}{2}u\right) \quad \text{Equation (15)}$$

where $k_1$ and $k_2$ are constants, and values of the constants are absorbed into the binary number stored in the ROMs, for example. No additional multiplication with k1 and k2 may be necessary because the numbers stored in the ROMs can be stored in a multiplied form.

Figure 3A:
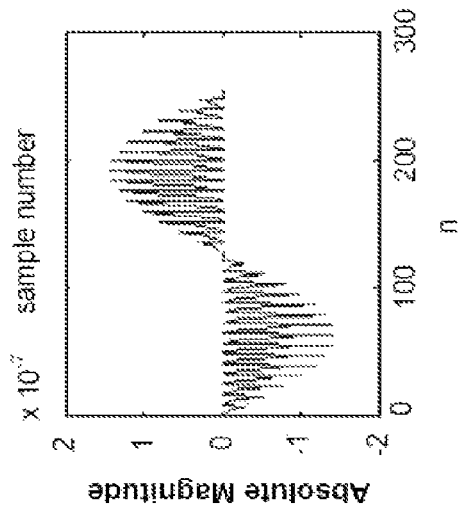
FIGS. 3A-3B are graphs that illustrate examples of outputs and relative magnitudes of first order and second order correction terms of the Taylor series expansion output.
Figure 3B:
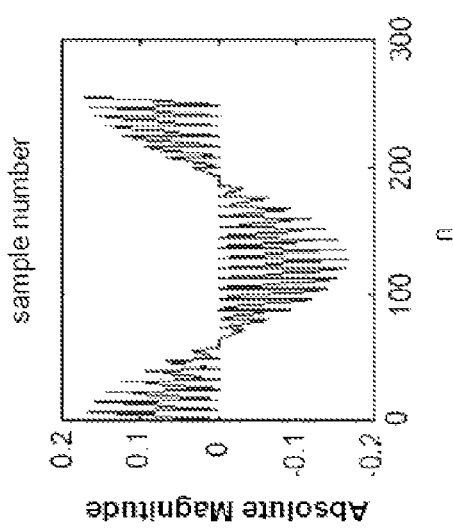

FIGS. 3A-3B are graphs that illustrate examples of outputs and relative magnitudes of first order and second order correction terms of the Taylor series expansion output. The graph in FIG. 3A corresponds to example outputs of values of the ROMs 210 and 212, and the graph in FIG. 3B corresponds to example outputs of values of the ROM 214. It can be seen from these graphs that the second order correction term is much smaller than the first order correction term. The fine ROM 214 outputs values of a small magnitude compared to the intermediate ROMs 210 and 212.

Figure 4:
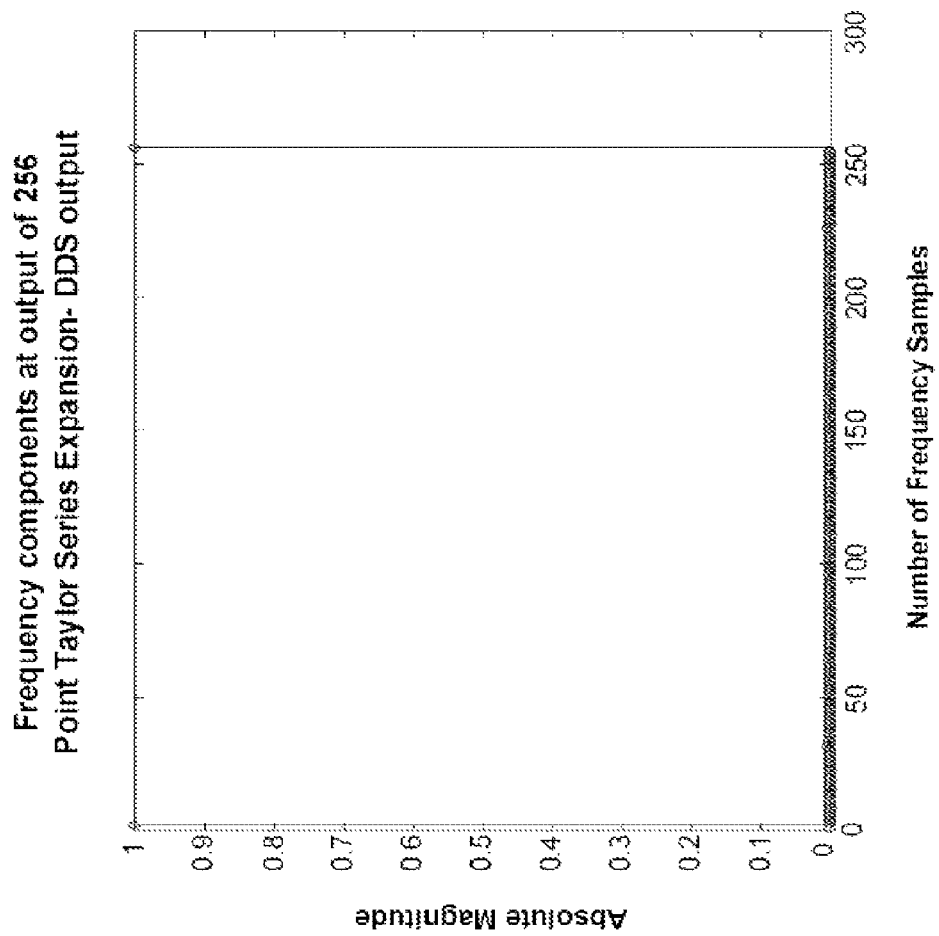
FIG. 4 is a graph that illustrates example Fourier transform of an output of an adder.

FIG. 4 is a graph that illustrates an example Fourier transform of an output of the adder 224. The graph illustrates an output power spectrum, and shows a single bar with the remaining spectrum being flat. This represents a single frequency being output, such that the output power spectrum is spectrally pure. Energy outside of the desired frequency is not present (e.g., within an approximation of about ±10 Hz).

Exemplary embodiments of a DDS may thus output a Taylor series expansion of a sinusoid signal output without using any multiplication to generate the output. Aspects of exemplary embodiments include replacing multiplication of two signals by a single adder and two fixed shifts, for example. Power savings can be achieved due to fewer transistors with the multiplier being replaced by an adder and two fixed shifts, for example. In addition, silicon or die area of the DDS can be reduced with less transistors being used, and delay time associated with the multiplier and hence path delay of the DDS can also be reduced.

Referring back to FIG. 2, the output of the 4-input adder 224 is fed to an output register 226. The bit-width of the output register 226 may be at least 2 bits greater than bit-widths of registers 216-222, for example, to enable more storage. The output of the register 226 is fed to the DAC 206, which outputs an analog sinusoidal signal.

An output frequency of the DDS 200 may be determined by:

$$f_0 = \frac{\Delta_f}{2^P} f_c \quad \text{Equation (16)}$$

where $\Delta_f$ is a frequency step size, $2^P$ is a maximum count of the phase accumulator 202, and $f_c$ is a clock frequency of the input. A maximum frequency may be limited by a delay through a slowest ROM, which in practice may be a coarse ROM, and a delay through the 4-input adder. In one example, $\Delta_f$ may be about 1 Hz, $2^P$ may be about 16384, and $f_c$ may be about 500 MHz.

Latency of the DDS 200 can be expressed as a sum of ROM access time and a delay through the 4 input adder as follows:

$$L_{Taylor} = T_{acc\_ROM\_max} + T_{adder} \quad \text{Equation (17)}$$

where $T_{acc\_ROM\_max}$ is the access time of the slowest ROM. A minimum phase step for the DDS 200 can be expressed simply as:

$$\Delta\phi = \frac{2\pi}{2^P} \quad \text{Equation (18)}$$

where P is a number of bits output from the phase accumulator 202, for example.

While the DDS 200 in FIG. 2 is described with memory in the form of ROMs 208-214, the memory may be in other forms as well, such as, for example, random access memory (RAM), EEPROM, flash memory or any type of computer storage media including non-transitory computer readable medium, and volatile or non-volatile storage systems.

In one embodiment, components of the DDS 200 may be implemented on a single integrated circuit or field programmable gate array (FPGA). In another embodiment, components of the DDS 200 may be implemented on multiple integrated circuits or FPGAs. Still further, in another embodiment, components of the DDS 200 may be implemented as a 3-dimensional integrated circuit.

Figure 5A:
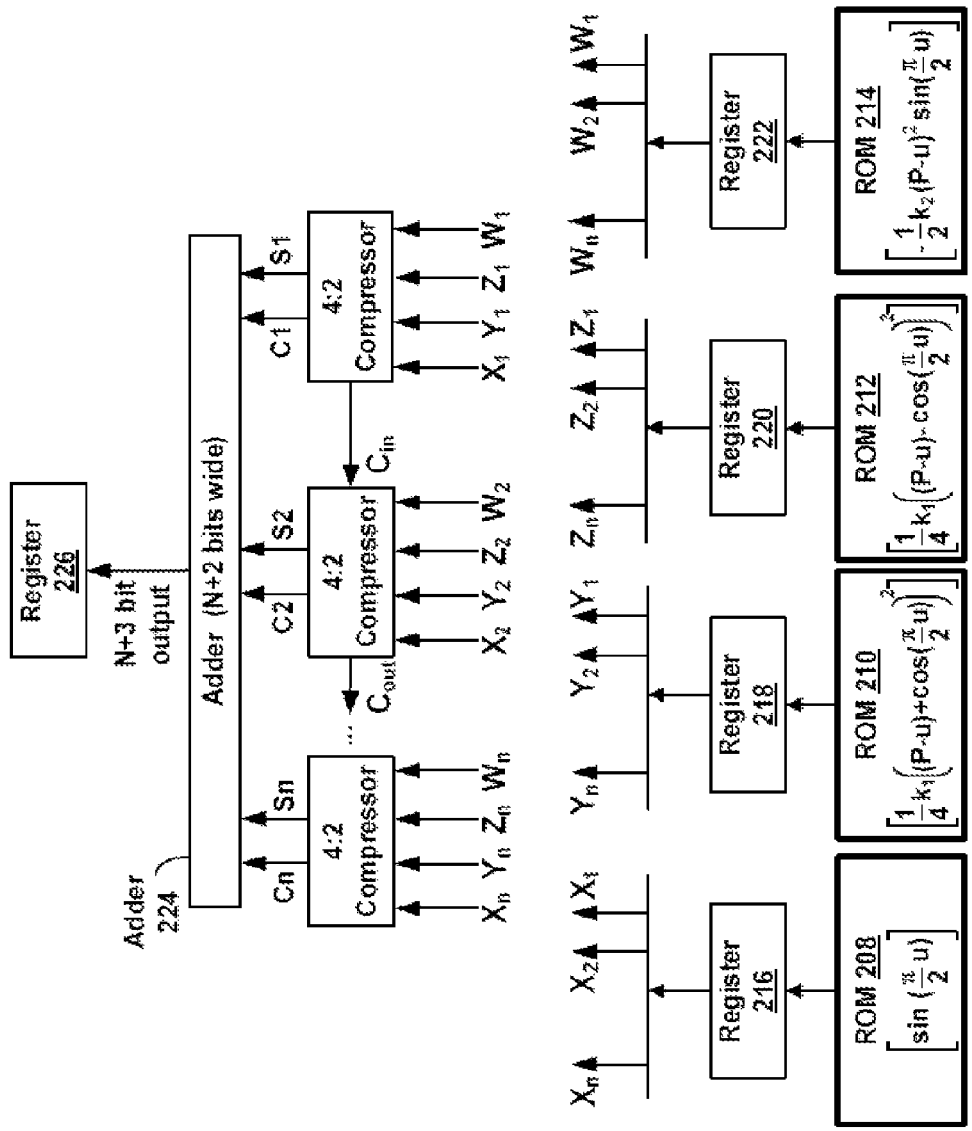
FIGS. 5A-5C illustrate example components of a 4-input adder.

FIG. 5 illustrates example components of an 4-input adder, such as that used in the phase to amplitude converter 204 of FIG. 2. In FIG. 5A, a 4-input adder is shown comprising a number of 4:2 compressors that each output to an adder. Outputs of each of the four ROMs in FIG. 2 (ROMs 208-214) are input to each of the compressors as $X_n$, $Y_n$, $Z_n$, and $W_n$. Thus, in one embodiment, a number of 4:2 compressors are provided equal to a number of bits output from the ROMs. The 4:2 compressors provide an output (C1) that represents the sum of the four inputs independent on the carry in signal ($C_{in}$). The $C_{out}$ signal forms the $C_{in}$ signal for the next 4:2 compressor. Outputs of the 4:2 compressors are shown below in the table.

TABLE 1

Truth table for the 4:2 compressor cell

| Inputs | | | | Cin = 0 | | Cin = 1 | | |
|---|---|---|---|---|---|---|---|---|
| A | B | C | D | Carry | Sum | Carry | Sum | Cout |
| 0 | 0 | 0 | 0 | 0 | 0 | 0 | 1 | 0 |
| 0 | 0 | 0 | 1 | 0 | 1 | 1 | 0 | 0 |
| 0 | 0 | 1 | 0 | | | | | |
| 0 | 1 | 0 | 0 | | | | | |
| 1 | 0 | 0 | 0 | | | | | |
| 0 | 0 | 1 | 1 | 0 | 0 | 0 | 1 | 1 |
| 0 | 1 | 1 | 0 | | | | | |
| 1 | 0 | 1 | 0 | | | | | |

TABLE 1-continued

Truth table for the 4:2 compressor cell

| Inputs | | | | Cin = 0 | | Cin = 1 | | |
|---|---|---|---|---|---|---|---|---|
| A | B | C | D | Carry | Sum | Carry | Sum | Cout |
| 0 | 1 | 0 | 1 | | | | | |
| 0 | 1 | 1 | 1 | 0 | 1 | 1 | 0 | 1 |
| 1 | 1 | 1 | 0 | | | | | |
| 1 | 1 | 0 | 1 | | | | | |
| 1 | 1 | 0 | 1 | | | | | |
| 1 | 1 | 1 | 0 | | | | | |
| 1 | 1 | 1 | 1 | 1 | 0 | 1 | 1 | 1 |

The 4:2 compressors operate to perform a bitwise addition of the outputs of the ROMs. Outputs of the 4:2 compressors are provided to an adder to output a value that has N+3 bits in length, for example.

Compressors can be implemented in logic in many different ways. FIG. 5B is an example logic diagram of one possible implementation of a 4:2 compressor. The compressor in FIG. 5B is shown to have a first stage that receives outputs from the ROMs ($X_1$-$X_4$) at XOR gates and a multiplexor. A second stage includes an XOR gate, and a third stage include a multiplexor and an XOR gate. In this example, the 4:2 compressor has a minimum delay value of that associated with 3 XOR gates.

Figure 5C:
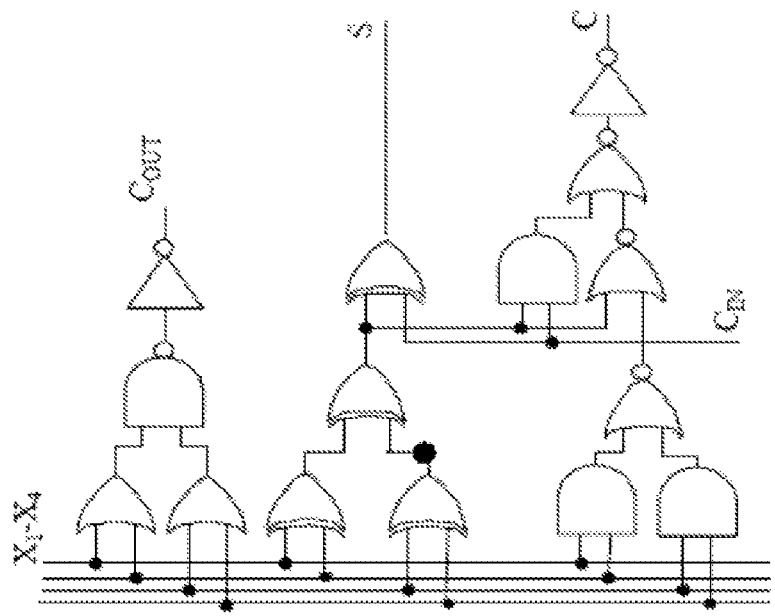
Figure 5B:
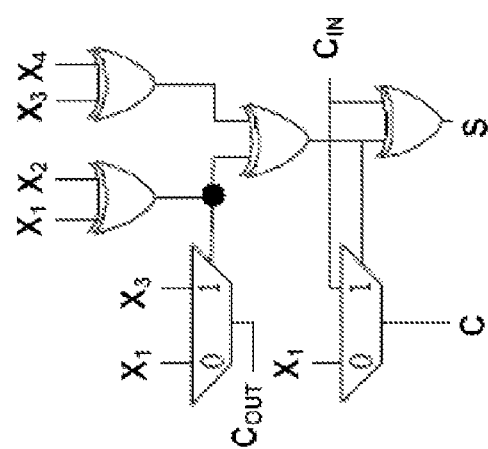

FIG. 5C is another example logic diagram of a possible implementation of a 4:2 compressor. In this example, the sum bit (S) has a minimum delay value of that associated with 3 XOR gates. However, the carry bit has a minimum delay value of that associated with 5 total gates. The 4-input adder can be considered to be of the order of a 2-input adder in terms of delay or time to process input signals.

It can be noted that, for generating the same output as the 4-input adder, three 2-input adders can be used. A path delay of a single 2-input adder would be ($T_{XOR}+T_{AND}+T_{OR}$), where $T_{AND}$ is a delay of an AND gate and $T_{OR}$ is a delay of an OR gate. Hence, the path delay associated with the three 2-input adders is [$3*(T_{XOR}+T_{AND}+T_{OR})$]. Thus, using a 4-input adder in the phase-to-amplitude converter may provide a shorter delay time than three 2-input adders. It can also be noted that $T_{MUX}$ in the 4-input adder has a smaller delay time than ($T_{AND}+T_{OR}$) in the 2-input adder, for example.

Still other designs for the adder functionality may be used, including, for example, a design with a multiplier and 2-adders. However, a multiplication process is a high delay process. In exemplary embodiments, the multiplication process can be replaced by 2 ROMs of small width and a shift, as described above with respect to Equation (9).

The 4-input adder 224 of FIG. 2 may operate at a same or similar data rate as a conventional 2-input adder to produce output data samples. The path delay of the 4 input adder is that of two XOR gates followed by a multiplexer which is of the same order as a 2-input adder.

Within exemplary embodiments, using a Taylor series output of $$\sin\left(\frac{\pi}{2}u\right)$$

may be given in the format as shown in Equation (15), rather than in the traditional format shown in Equation (2). Generating the output in the form of Equation (15) may reduce a path delay. For example, a ratio of an output frequency of a DDS generating the output in the form of Equation (15) versus a DDS generating the output in the form of Equation (2) is given below.

$$\frac{F_{output[Eq.15]}}{F_{output[Eq.2]}} = \frac{\left(\frac{1}{2^N} * \frac{1}{T_a}\right)}{\left[\frac{1}{2^N}\left(\frac{1}{T_m + 2T_a}\right)\right]}$$

$$= F_{out[Eq.\ 15]} / F_{out[Eq.\ 2]}$$

$$= (T_m + 2T_a)/T_a$$

$$\approx 20$$

Equation (19)

Thus, in exemplary embodiments, throughput can be increased by $(T_m+2T_a)/T_a$, where $T_m$ is the delay associated with the multiplier in a conventional DDS and $T_a$ is a delay associated with the adder.

Further, replacement of a multiplier and 2-adders by a 4:2 adder, as shown in FIG. 2, helps reduce dynamic power consumption and area overhead of the DDS 200. It can be noted that delay associated with 2-adders (in a conventional DDS) is similar or the same as the delay associated with the 4-input adder. In exemplary embodiments, multiplication is replaced by 2 ROMs of small width and a shift. An approximate measure of less delay due to replacement of the multiplier and the two adders with a single 4:2 adder is about 140 picoseconds to 2.39 ns (using an 8×8 multiplier in 180 nm TSMC). For a 16×16 multiplier, the delay rises to about 8 ns so that ratio of the Tm/Ta>17. In the DDS 100, the acceleration may be over Tm+2Ta/Ta>20.

Figure 6A:
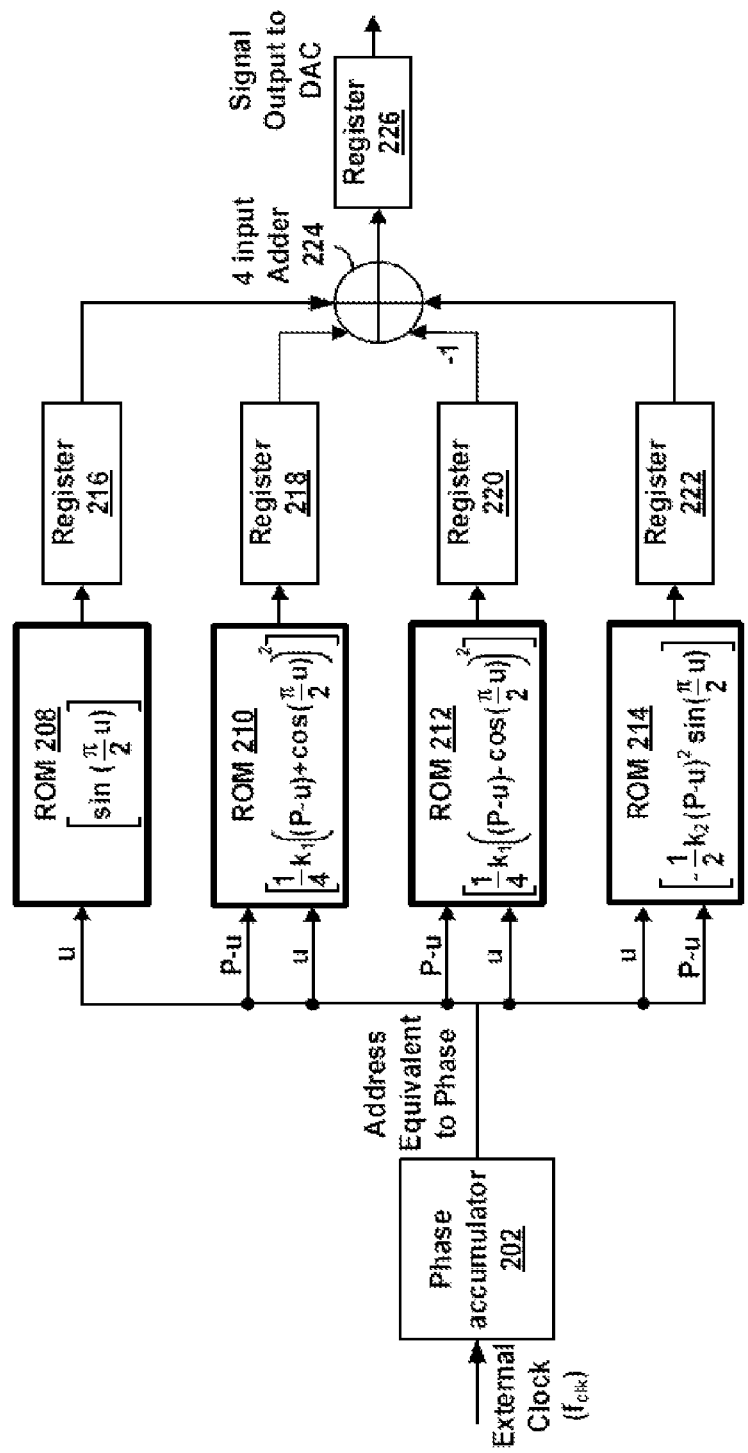
FIGS. 6A-6B is a block diagram illustrating a portion of the DDS in FIG. 2.

In one aspect of exemplary embodiments, power consumption can be reduced by an arrangement which allows either a coarse ROM/fine ROM combination to work or only a coarse ROM so as to power down the fine ROMs and bypass the adder. FIG. 6 is a block diagram illustrating a portion of the DDS 200 in FIG. 2. As shown in FIG. 6A, the 4-input adder 224 receives outputs from all ROMs 208-214 and sums the outputs to provide a signal to the DAC.

Figure 6B:
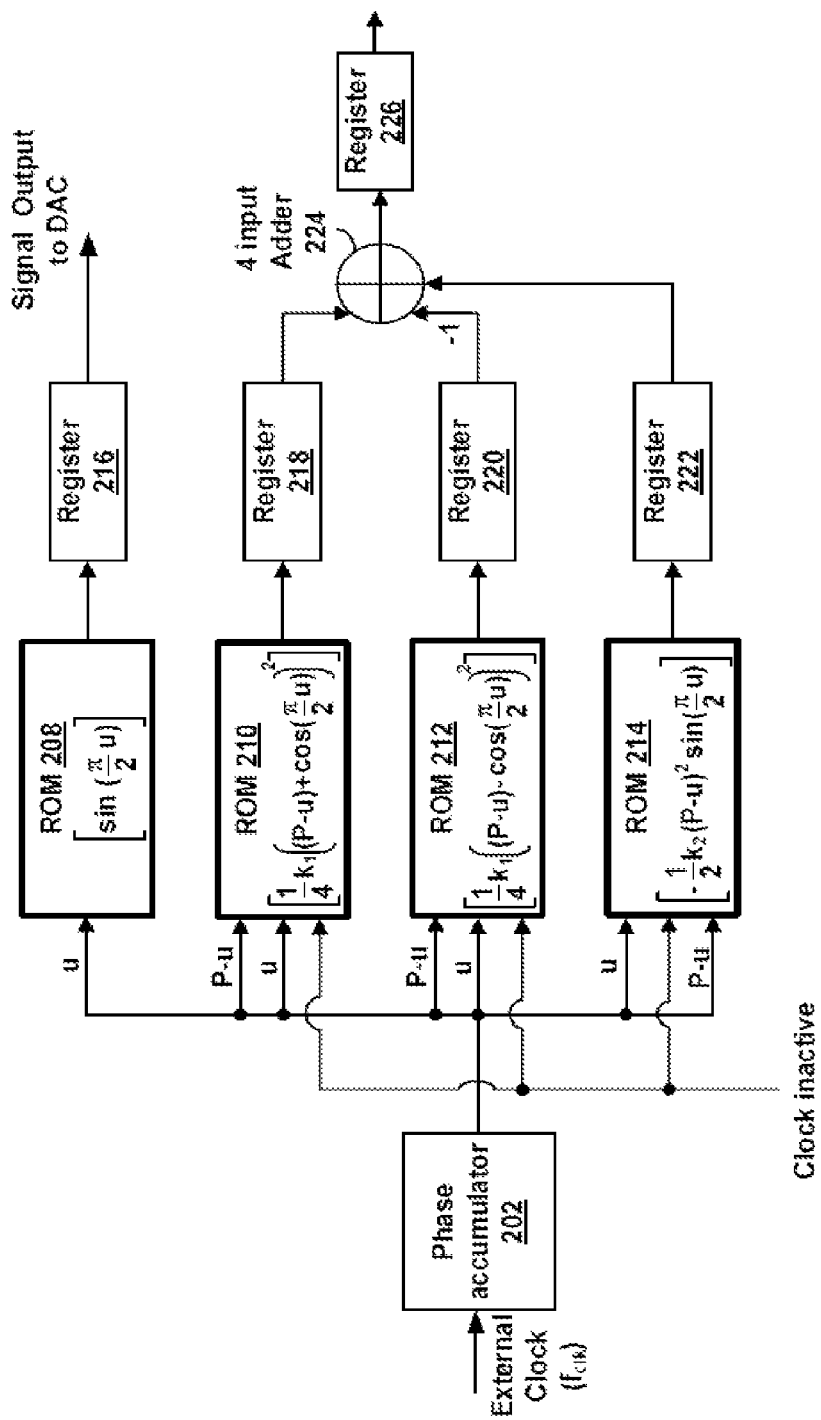

In FIG. 6B, ROMs 210, 212, and 214, receive clock inactive signals to power down these components. When the clock inactive signal is provided (e.g., or by not providing a clock signal), only the output of ROM 208 is provided to the DAC, and this is the low power output. When the clock signals are provided to all ROMs, the DDS 200 functions as described above, and the normal power output is provided from the register 226 to the DAC.

A processor (not shown) may be included within or coupled to the DDS 200 and may operate to control when the clock is active or not active, for example.

Dual mode operation allows operation of only the coarse ROM to provide a lower SFDR so as to reduce power consumption. Dual mode operation enables one mode for high resolution and SFDR (e.g., about 94 dB), and another mode with lower SFDR (e.g., about 72 dB) in low power mode.

Figures 7A, 7B:
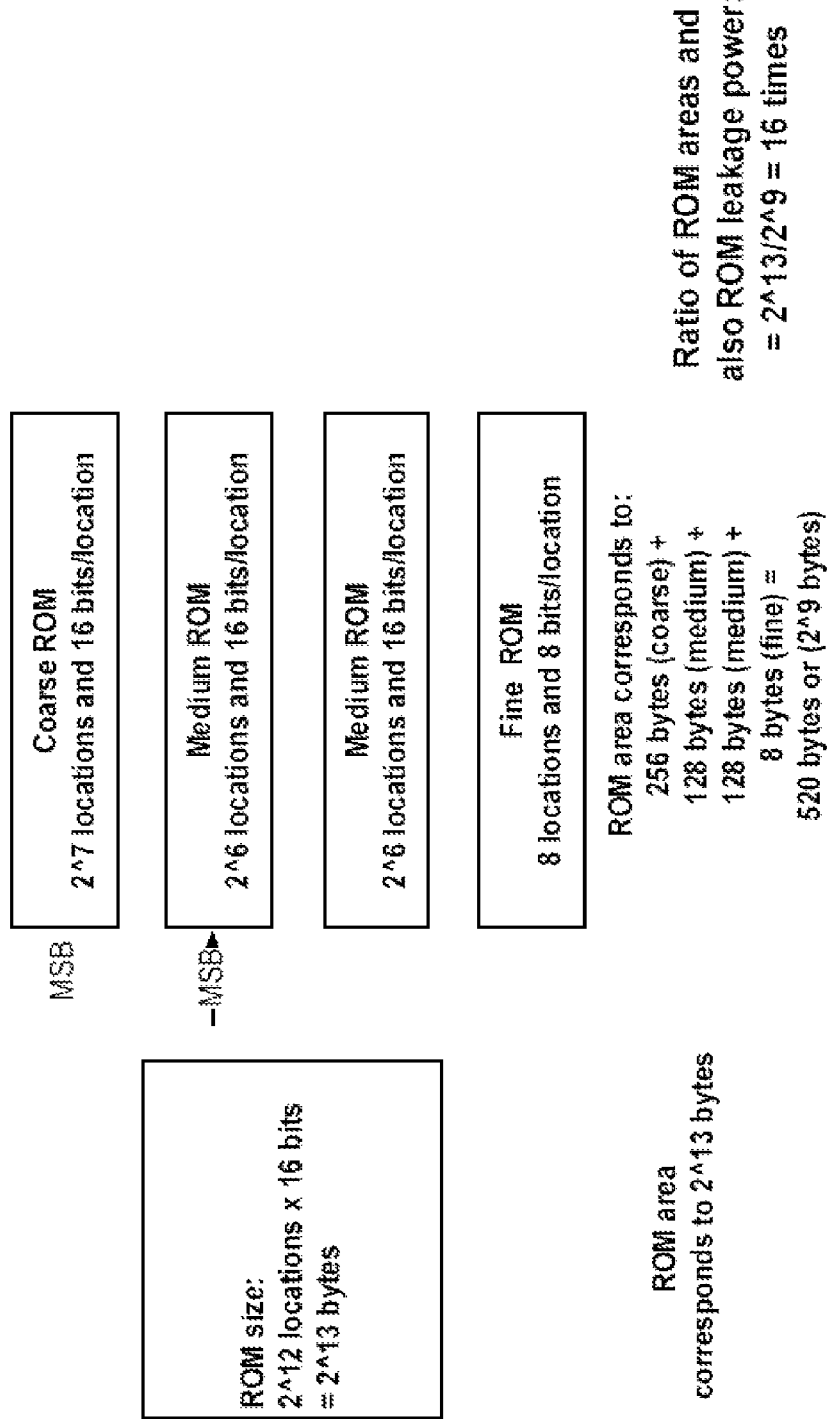
FIGS. 7A-7B illustrate a comparison of example ROM sizes.

Within the configuration of the DDS 200 shown in FIG. 2, four distinct ROMs 208-214 are shown. As described above each of the ROMs 208-214 may be of a different size, such as a coarse ROM, a medium ROM, and a fine ROM. Alternatively, although not shown, one larger ROM may be used instead of four separate ROMs. FIGS. 7A-7B illustrate a comparison of example ROM sizes. FIG. 7A illustrates that one ROM may be used that has $2^{12}$ location and 16 bits per location for a total of $2^{13}$ bytes of information. FIG. 7B illustrates ROM area corresponding to the four ROMs. The coarse ROM may have $2^7$ locations and 16 bits per location, the medium ROMs may have $2^6$ locations and 16 bits per location, and the fine ROM may have $2^3$ locations and 8 bits per location, for a total of 520 ($2^9$) bytes of information. A comparison of the configurations shown in FIGS. 7A and 7B illustrates that using one large ROM may result in about 16 times more ROM area and also as much more leakage power, for example (i.e., $2^{13}/2^9=16$).

Using 4 ROMs instead of one large ROM can achieve a SFDR of greater than 100 dB, for example. Additional benefits include reduced leakage power and lower area of silicon used. The leakage power may be directly proportional to the ROM size and the number of transistors in the overall arrangement, for example.

Figures 8A, 8B:
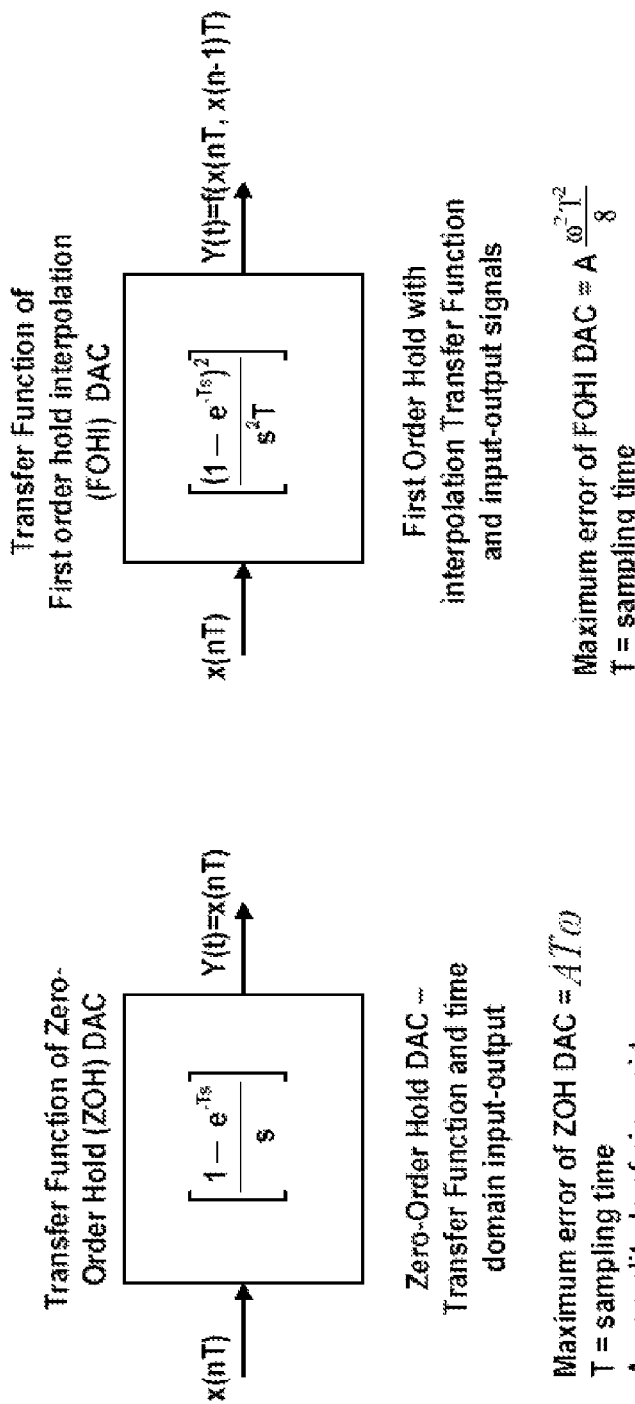
FIGS. 8A-8B illustrate examples of a zero order hold DAC and a first order hold interpolation (FOHI) DAC.

In exemplary embodiments, the DDS, such as that shown in FIG. 1, includes or is coupled to a DAC. The DAC may be a zero order hold DAC or a first order hold interpolation (FOHI) DAC, for example. FIGS. 8A-8B illustrate examples of the zero order hold DAC and the first order hold interpolation (FOHI) DAC.

In FIG. 8A, a zero-order hold DAC is illustrated. The zero-order hold DAC is connected to an output of the storage register that receives outputs of the 4-input adder. For example, the DAC 206 in FIG. 2 may be a zero-order hold DAC. The zero-order hold DAC may have a transfer function of $$\left[\frac{1-e^{-Ts}}{s}\right],$$

and thus, for an input of x(nT), an output is given by:

Output=$y(t)$={$x(nT)$}   Equation (20)

where T is a sampling rate of the DAC.

In FIG. 8B, a FOHI DAC is illustrated. The FOHI is connected to an output of the storage register that receives outputs of the 4-input adder. For example, the DAC 206 in FIG. 2 may be a FOHI DAC. The FOHI DAC may have a transfer function of $$\left[\frac{(1-e^{-Ts})^2}{s^2T}\right],$$

and thus, for an input of x(nT), an output is given by:

Output=$y(t)$={$x(nT)$}   Equation (21)

where T is a sampling rate of the DAC.

The function of the DAC is to change the form of a variable from a pattern of bits in the digital word into a continuous (normally piecewise continuous) analog voltage signal. To obtain a smooth output from the DAC, the FOHI DAC may be employed. If interpolation between sample points is used on the FOHI DAC, there may be no discontinuous jumps since the linear portions of the output start and end on sampled values.

A measure of smoothness of a DAC is a maximum error between the DAC output and a corresponding continuous input sine wave signal (e.g., x=A sin ωT).

For a ZOH DAC, the error can be approximated as:

$$\varepsilon = A\sin\left[\left(n + \frac{\tau}{T}\right)\varpi T\right] \approx A\sin(n\varpi T)\ 0 \le \tau < T \quad \text{Equation (22)}$$

which is a maximum near the zero crossing of the sine wave. If the time nT is at the crossing, the maximum error occurs when τ–T. The maximum error is then given by:

$$\epsilon_{max} = A \sin(\omega T) \quad \text{Equation (23)}$$

and for small ωT, the maximum error is approximated by:

$$\epsilon_{max} \approx A\omega T \quad \text{Equation (24)}$$

With respect to FOHI DACs, the maximum error for FOHI occurs when ωT is near π/2. If the sample points are equally spaced about the peak amplitude, the maximum error occurs at the peak of the sine wave. Thus, the FOHI DAC error relation is given by:

$$\varepsilon = A\sin\frac{\pi}{2} - \left\{ A\sin(n\omega T) - A\frac{\tau}{T}\sin(n\varpi T) + A\frac{\tau}{T}\sin[(n+1)\omega T] \right\} \quad \text{Equation (25)}$$

$$0 \le \tau < T$$

Under these conditions, nT occurs at t=π/2ω–T/2, so that n=π/2ωT–1/2, and the maximum error occurs when τ=½. On substituting these values in the FOH error relation and assuming small ωT, the solution for maximum error is approximated as:

$$\varepsilon_{max} \approx \frac{A\varpi^2 T^2}{8} \quad \text{Equation (26)}$$

In the FOHI DAC, a current analog output signal level is dependent upon a previous sample of the digital output signal, for example. In contrast, in the ZOH DAC, a current analog output signal level is dependent on only a current sample of the digital input data (e.g., no dependence on previous samples). As shown above, the ZOH DAC exhibits more error than the FOHI DAC. Using a FOHI DAC reduces the overall maximum error by factor of 8, and produces a smoother DDS output, for example. The FOHI DAC may have advantages in use over the zero-order hold DAC in terms of the maximum error being smaller by an order of magnitude $T^2$ versus T for the same input waveform frequency, for example. The FOHI DAC offers a way to replace the stair-step output of the ZOH DAC with a smooth signal. However, within exemplary embodiments, the DAC may be a ZOH DAC, a FOHI DAC, or other types of DACs as well.

Table 1 below gives example values of approximate maximum errors of a ZOH and an FOHI DAC using the relative smoothness representation of a sine wave of amplitude A and frequency ω.

TABLE 2

| | Relative error $\frac{\varepsilon_{max}}{A}$ | |
|---|---|---|
| ωT | ZOH | FOHI |
| 0.1 | 0.1 | 0.00125 |
| 0.2 | 0.2 | 0.005 |
| 0.3 | 0.3 | 0.01125 |
| 0.4 | 0.4 | 0.02 |
| 0.5 | 0.5 | 0.03125 |
| 0.6 | 0.6 | 0.045 |

In exemplary embodiments, components of a DDS may be implemented on a single integrated circuit or field programmable gate array (FPGA), and in other embodiments, components of the DDS may be implemented on multiple integrated circuits or FPGAs. Still further, in another embodiment, components of the DDS may be implemented as a 3-dimensional integrated circuit.

Within embodiments where components may be implemented on multiple circuits, the memory components (e.g., Coarse ROMs, intermediate ROMs, and fine ROMs of the DDS as shown in FIG. 2) may be located on one integrated circuit and the 4-input adder may be located on a different integrated circuit. In one example, components of the DDS may be provided using a 3D package that contains two or more chips (integrated circuits) stacked vertically so that the chip occupy less space, or arranged using a carrier substrate containing through-silicon vias (TSVs) to connect the multiple integrated circuits. The TSV is a vertical electrical connection (via) passing completely through a silicon wafer or die. The multiple integrated circuits may be wired together along edges, or may contain TSVs replacing edge wiring by creating vertical connections through a body of the integrated circuits. A resulting 3D integrated circuit may be considered a single integrated circuit built by stacking silicon wafers and/or dies and interconnecting them vertically so that the silicon dies behave as a single device.

Figure 9A:
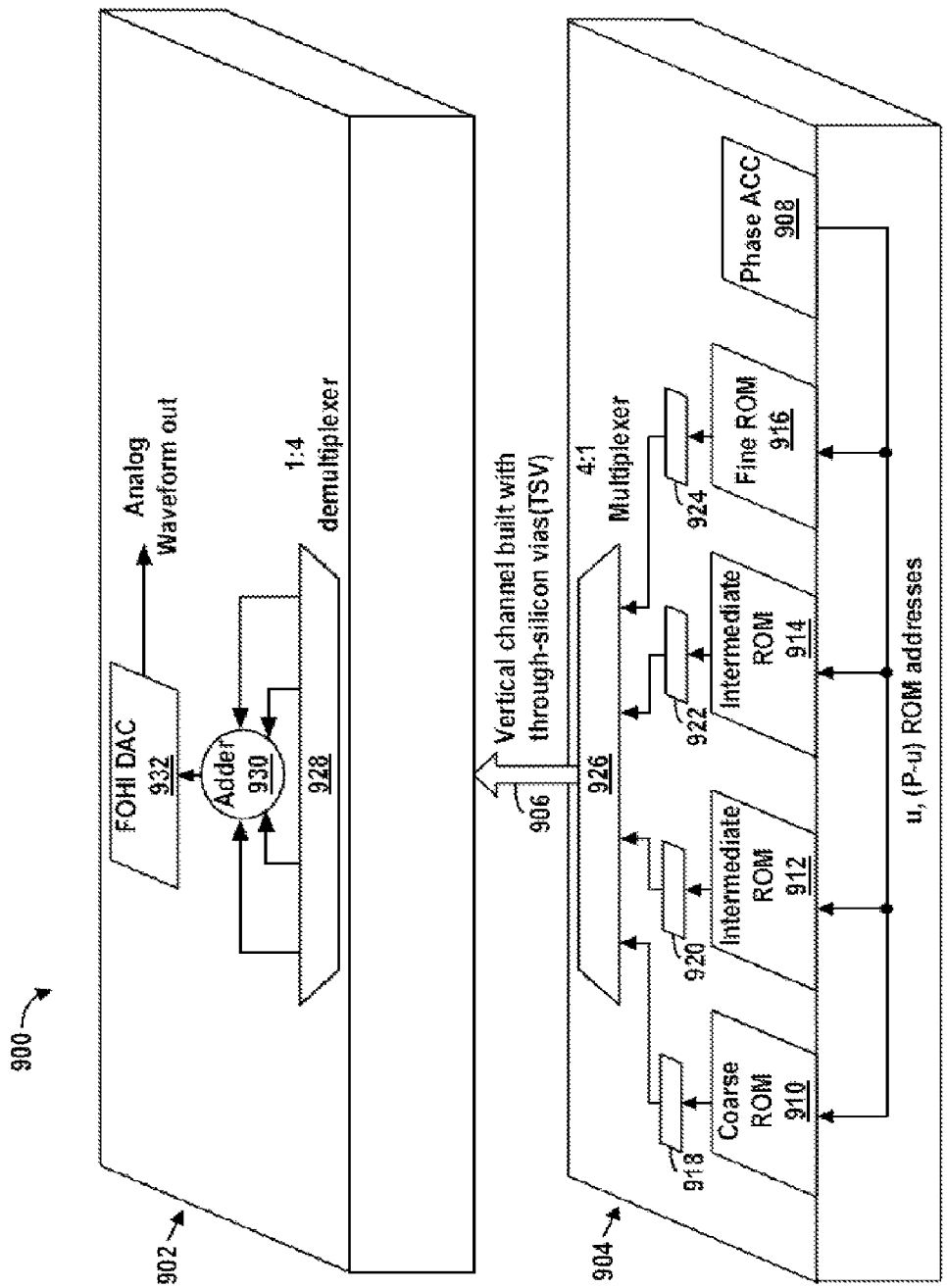
FIGS. 9A-9B is a conceptual block diagram illustrating an example of a DDS with memory components (e.g., ROMs) located on one integrated circuit and an adder located on another integrated circuit.

FIG. 9A is a conceptual block diagram illustrating an example of a DDS 900 with memory components (e.g., ROMs) located on one integrated circuit 902 and an adder located on another integrated circuit 904. Each integrated circuit may be a layer of silicon, for example, that is connected by vertical channels built through silicon vias, such as via 906.

Each of the components in the DDS 900 on the integrated circuits 902 and 904 may be the same as or similar to the components of the DDS 200 described in FIG. 2, for example. The integrated circuit 904 may include a phase accumulator 908, a course ROM 910, intermediate ROMs 912 and 914, and a fine ROM 916, each of which outputs to a respective register 918-924. The integrated circuit 904 may also include a 4:1 multiplexer 926, and each register 918-924 can output to the multiplexer 926. The multiplexer 926 outputs to a 1:4 demultiplexer 928 on the integrated circuit 902 through the silicon via 906. The 1:4 demultiplexer 928 outputs to an adder 930, which outputs (possibly through an output register) to a FOHI DAC 932. The FOHI DAC 932 outputs an analog waveform.

Figure 9B:
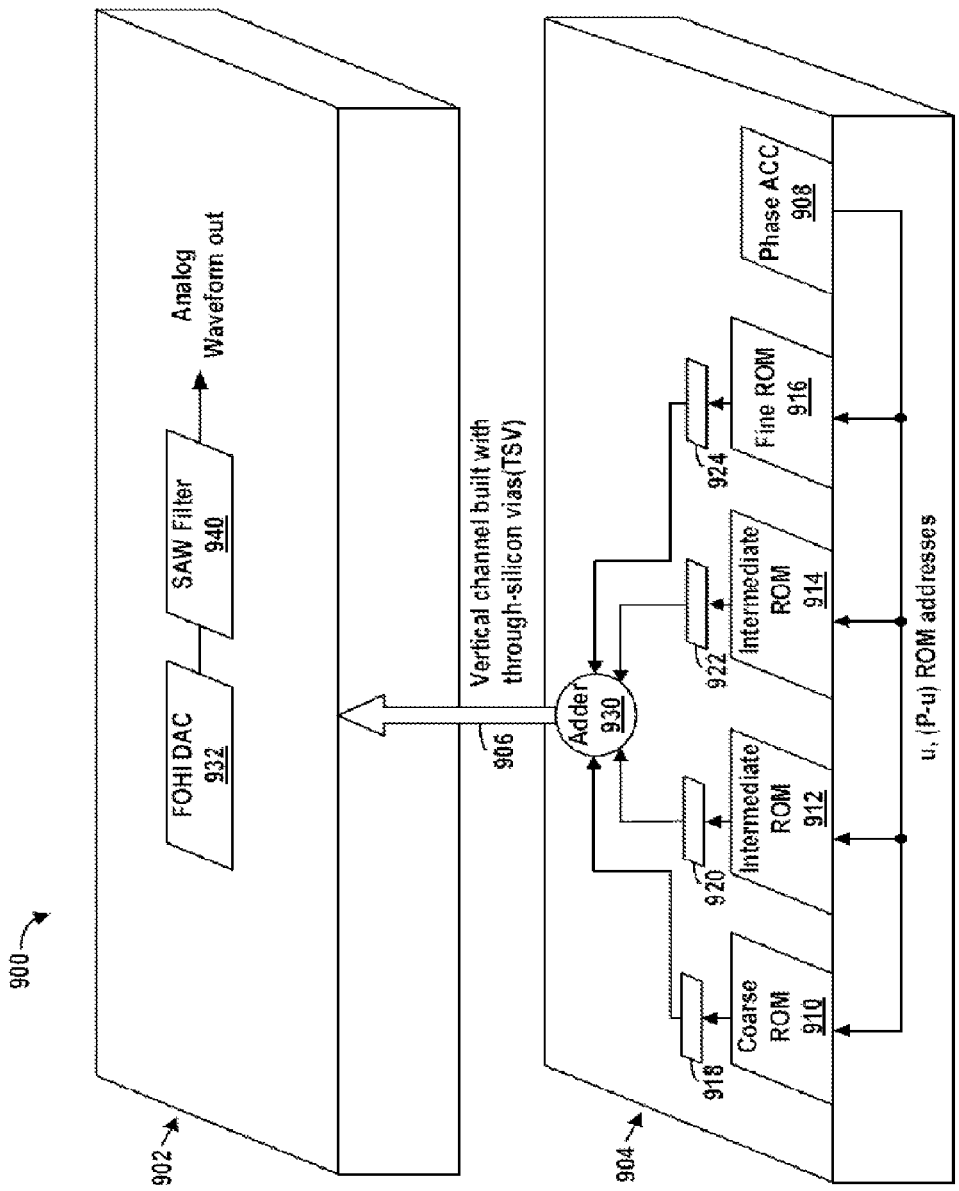

FIG. 9B is another conceptual block diagram illustrating the DDS 900. However, in FIG. 9B, the adder 930 is locate on integrated circuit 904, and an output of the adder 930 is provided through the silicon via 906 to the FOHI DAC 932 that is located on the integrated circuit 902. Furthermore, the FOHI DAC 932 may output to a SAW filter 940, or low-pass filter, which is located on the integrated circuit 902, to provide the analog waveform output, for example.

Figure 10:
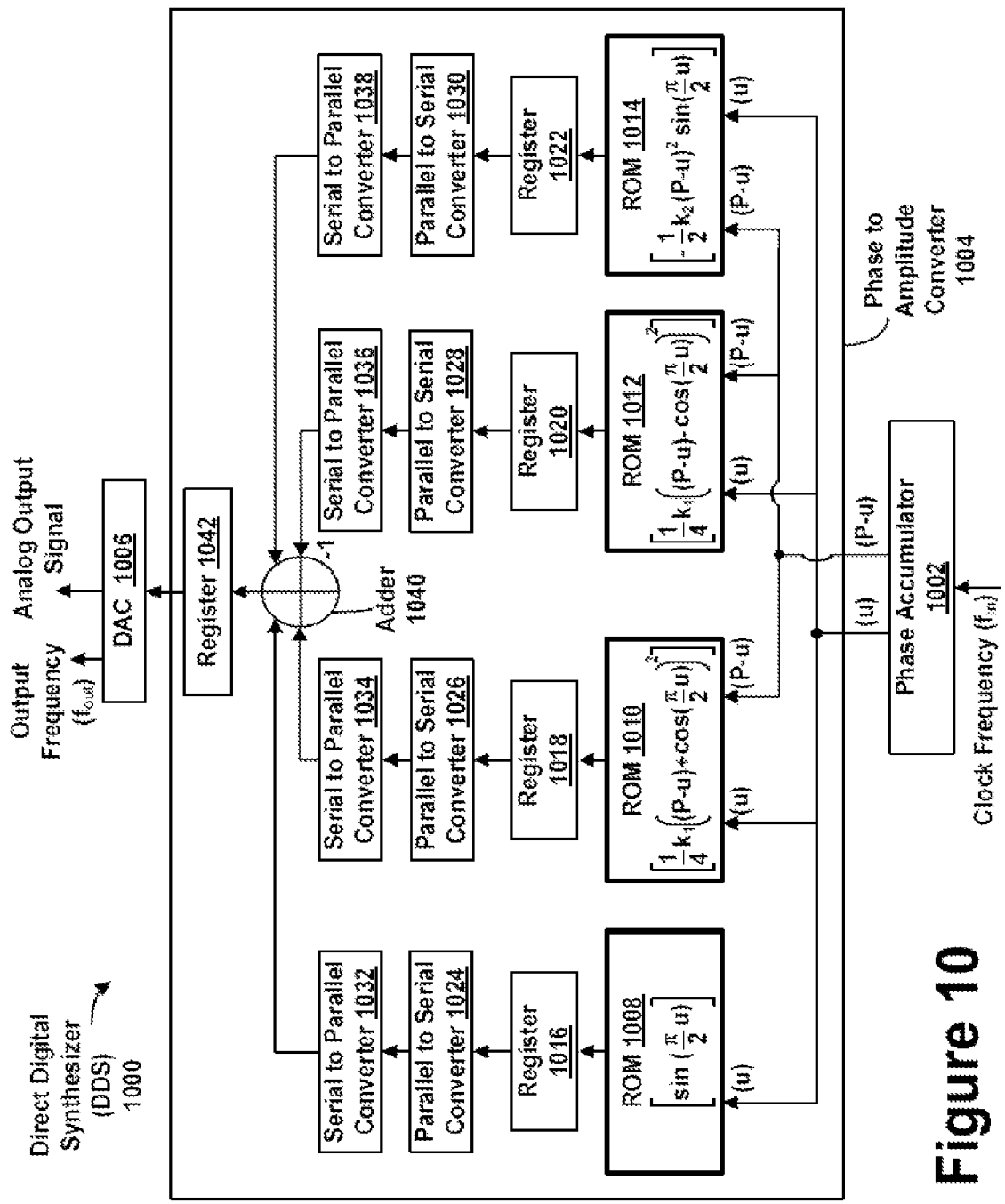
FIG. 10 is a block diagram illustrating a DDS in which memory components of the DDS are located on one portion of an integrated circuit and the adder and DAC are located on a different portion of the integrated circuit or on another integrated circuit.

In exemplary embodiments, the memory components of the DDS can be located on one portion of an integrated circuit and the adder and DAC can located on a different portion of the integrated circuit or on another integrated circuit. To transport data words from the memory to the adder, additional components may be added. FIG. 10 is a block diagram illustrating a DDS 1000 in which memory components of the DDS are located on one portion of an integrated circuit and the adder and DAC are located on a different portion of the integrated circuit or on another integrated circuit.

The DDS 1000 operates substantially the same as the DDS 200 in FIG. 2 and components common between the DDS 200 and the DDS 1000 may have the same functions. The DDS 1000 includes a phase accumulator 1002 that outputs to a phase to amplitude converter 1004, which outputs to a DAC 1006. The phase to amplitude converter 1004 includes 4 ROMs 1008-1014 that receive row/column addresses from the phase accumulator 1002 and output corresponding stored values to registers 1016-1022.

The phase to amplitude converter 1004 may also include parallel to serial converters 1024-1030 receiving outputs from the registers 1016-1022 and converting the outputs to a serial format. The phase to amplitude converter 1004 may also include serial to parallel converters 1032-1038 receiving outputs from the parallel to serial converters 1024-1030 and converting the outputs into a parallel form for input to an adder 1040. The adder 1040 outputs to a register 1042, which outputs to the DAC 1006.

The parallel to serial converters 1024-1030 may be located on one integrated circuit with the memory components (ROMs 1008-1014), and the serial to parallel converters 1032-1038 may be located on another integrated circuit (or another portion of the same integrated circuit) with the adder 1040 and the DAC 1006. Thus, there may be a considerable length of interconnect to traverse from the ROMs 1008-1014 to the adder 1040. If the ROMs have 32 bit outputs, there would be a significant amount of switching/interconnect capacitance from the ROMs 1008-1014 to the adder 1040, and thus, the parallel to serial converters 1024-1030 convert the ROM outputs to a high speed serial bit stream for transfer to the adder 1042. At an input of the adder 1040, the serial to parallel converters 1032-1038 convert the serial bit stream to a parallel word.

Furthermore, in an embodiment of a three-dimensional silicon integrated circuit, the adder 1040 may be on a different logical plane than the ROMs 1008-1014, and thus, it may be more desirable to run serial bit streams through silicon vias between planes instead of running all parallel lines between the vias, for example.

Although FIG. 10 is described to include additional components when the memory components of the DDS are located on one portion of an integrated circuit and the adder and DAC are located on a different portion of the integrated circuit or on another integrated circuit, the additional components of the parallel to serial converters 1024-1030 and the serial to parallel converters 1032-1038 may also be included in an embodiment of a DDS when all components of the DDS are co-located or substantially co-located to help pass signals between the ROMs and the adder, for example.

Figure 11A:
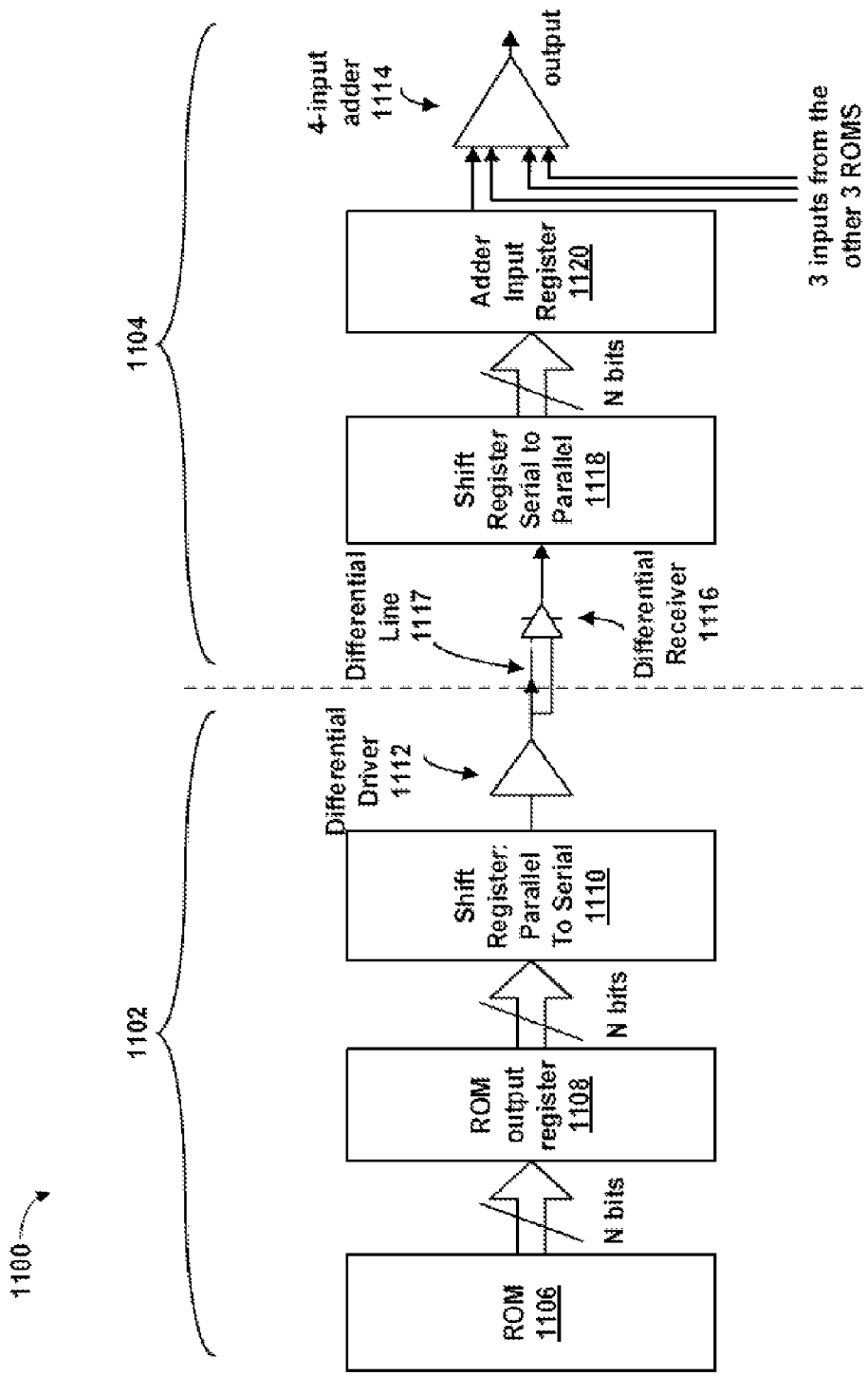
FIGS. 11A-11B is a block diagram illustrating a portion of a DDS in which memory components are located on one portion of an integrated circuit, and an adder and output of the DDS are located on another portion of the integrated circuit or on another integrated circuit.

FIG. 11 is a block diagram illustrating a portion of a DDS 1100 in which memory components are located on one portion of an integrated circuit 1102, and an adder and output of the DDS are located on another portion of the integrated circuit 1104 or on another integrated circuit. The DDS 1100 includes a memory component, ROM 1106, outputting N bits in parallel to a ROM output register 1108, which in turn, outputs the N bits in parallel to a parallel to serial shift register 1110. The parallel to serial shift register 1110 converts the parallel bit stream to a serial bit stream, and outputs to a differential driver 1112 that may include amplifiers and is used to drive the serial bit stream to the other portion of the integrated circuit 1104 (or to the other integrated circuit) that contains an adder 1114 and output.

A differential receiver 1116 receives the serial bit stream from the differential driver 1112 via a differential line 1117 and provides the serial bit stream to a serial to parallel shift register 1118 that converts the serial bit stream back to parallel words, which are output to an adder input register 1120. The adder input register 1120 outputs to the adder 1114. The adder 1114 also receives outputs, in a similar manner, to the adder 1114.

In this example, the differential interface between the differential driver 1112 and the differential receiver 1116 serves to generate a high data transmission rate using low power.

Figure 11B:
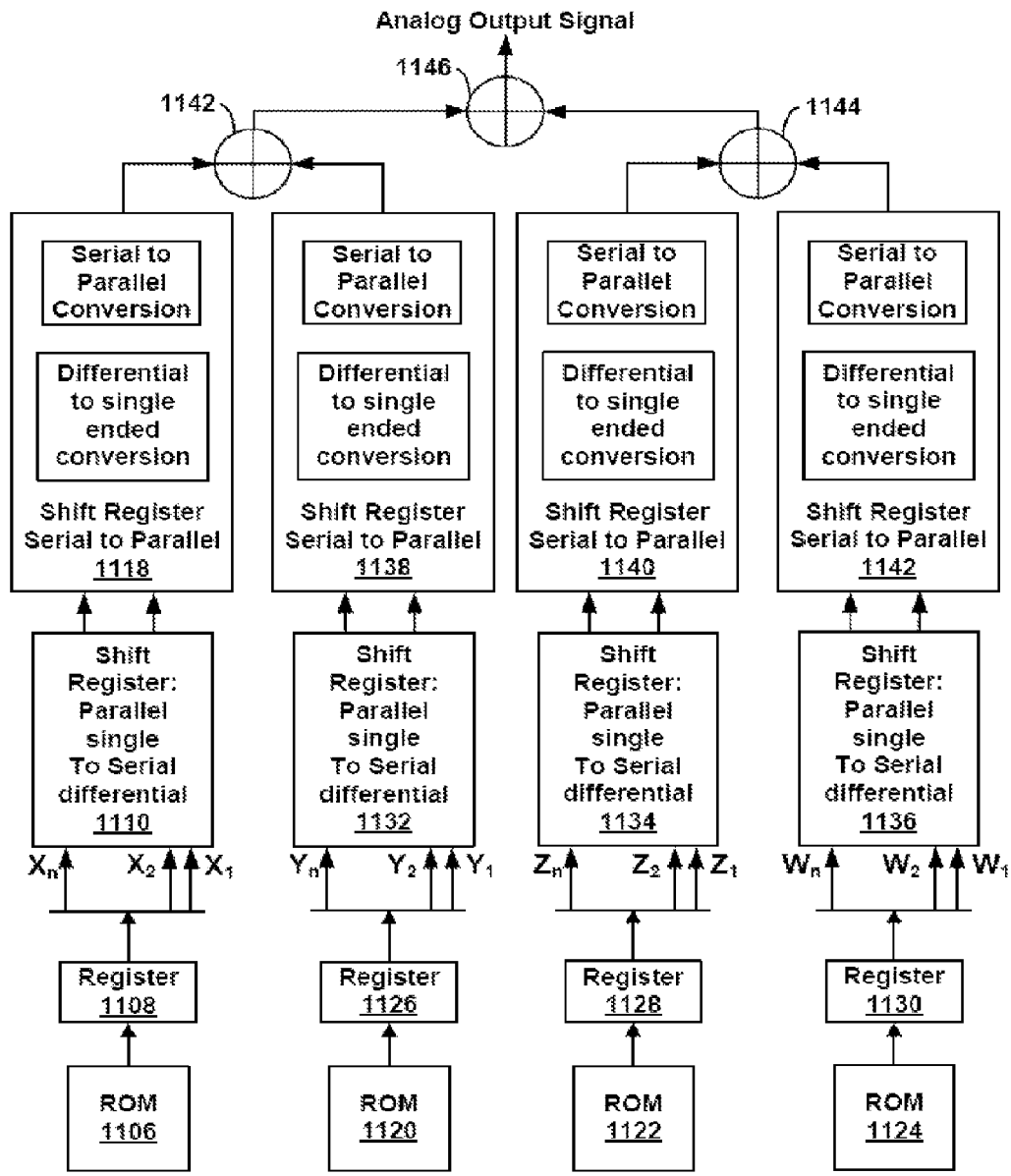

FIG. 11B illustrates an embodiment including 4 ROMs (1106, 1120, 1122, and 1124) each of which outputs to registers 1108, 1126, 1128, and 1130, respectively. The registers 1108, 1126, 1128, and 1130 output bits X, Y, Z, and W to shift registers 1110, 1132, 1134, and 1136 that convert the bits from parallel single ended to serial differential outputs for transmission across a plane to another integrated circuit (not shown), for example. The bits may be received at shift registers 1118, 1138, 1140 and 1142 to convert the bits to parallel single ended bits. Outputs of registers 1118 and 1138 may be provided to an adder 1142, and outputs of registers 1140 and 1142 may be provided to an adder 1144. Outputs of adders 1142 and 1144 can be provided to another adder 1146 to obtain the output. Using this configuration, 4:2 compressors may be removed with the addition of adders 1142 and 1144, for example.

Thus, multiple embodiments are described including one embodiment in which memory outputs are provided in parallel and feed directly to the adder, and another embodiment in which memory outputs are converted to a serial bit stream for transmission to the adder where the serial bit stream is converted to the parallel words to perform the addition.

Figure 12:
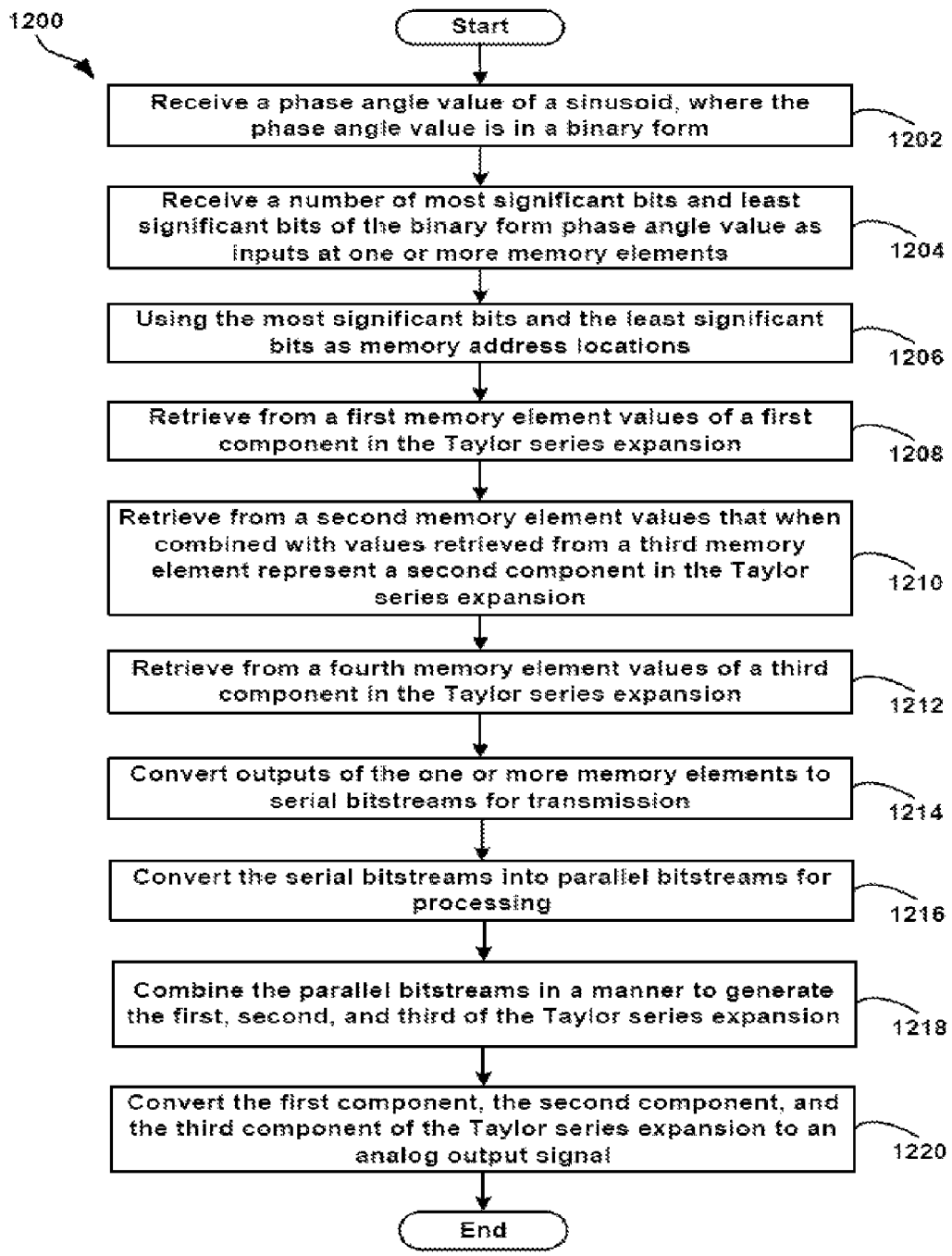
FIG. 12 shows a flowchart of an illustrative embodiment of a method for generating a Taylor series expansion of a sinusoid signal.

FIG. 12 shows a flowchart of an illustrative embodiment of a method 1200 for generating a Taylor series expansion of a sinusoid signal. It should be understood that for this and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example.

In addition, each block in FIG. 12 may represent circuitry that is wired to perform the specific logical functions in the process. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

Initially, at block 1202, a phase angle value of a sinusoid is received. The phase angle value may be in a binary form. At block 1204, a number of most significant bits and least significant bits of the binary form phase angle value are received as inputs at one or more memory elements. At block 1206, the most significant bits and the least significant bits are used as memory address locations to retrieve values from the memory elements. For instance, at block 1208, values of a first component in the Taylor series expansion are retrieved from a first memory element. At block 1210 values from a second memory element are retrieved that when combined with values retrieved from a third memory element represent a second component in the Taylor series expansion. At block 1212, values of a third component in the Taylor series expansion are retrieved from a fourth memory element.

Following, outputs of the one or more memory elements are converted to serial bitstreams for transmission, at block 1214. After transmission, the serial bitstreams are converted into parallel bitstreams for processing, at block 1216. The parallel bitstreams are combined in a manner to generate the first component, the second component and the third component of the Taylor series expansion, at block 1218. The first component, the second component and the third component of the Taylor series expansion are then converted to an analog output signal, at block 1220.

Figure 13:
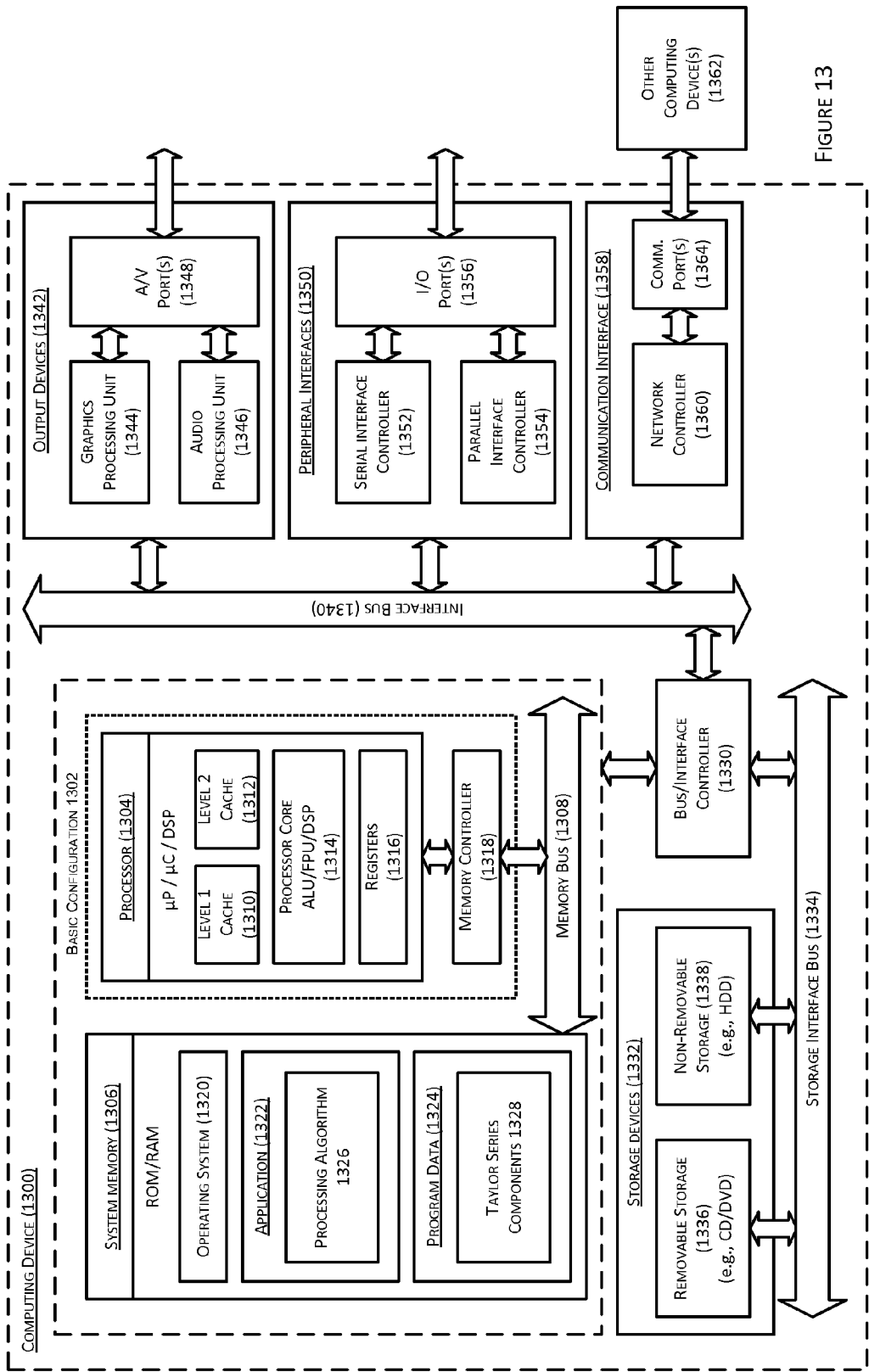
FIG. 13 is a block diagram illustrating an example computing device arranged for generating a Taylor series expansion of a sinusoid signal.

FIG. 13 is a block diagram illustrating an example computing device 1300 arranged for generating a Taylor series expansion of a sinusoid signal. In a very basic configuration 1302, computing device 1300 typically includes one or more processors 1304 and system memory 1306. A memory bus 1308 can be used for communicating between the processor 1304 and the system memory 1306.

Depending on the desired configuration, processor 1304 can be of any type including but not limited to a microprocessor ($\mu$P), a microcontroller ($\mu$C), a digital signal processor (DSP), or any combination thereof. Processor 1304 can include one more levels of caching, such as a level one cache 1310 and a level two cache 1312, a processor core 1314, and registers 1316. The processor core 1314 can include an arithmetic logic unit (ALU), a floating point unit (FPU), a digital signal processing core (DSP Core), or any combination thereof. A memory controller 1318 can also be used with the processor 1304, or in some implementations the memory controller 1318 can be an internal part of the processor 1304.

Depending on the desired configuration, the system memory 1306 can be of any type including but not limited to volatile memory (such as RAM), non-volatile memory (such as ROM, flash memory, etc.) or any combination thereof. System memory 1306 typically includes an operating system 1320, one or more applications 1322, and program data 1324. Application 1322 includes algorithms 1326 that may be arranged to perform any of the functions shown in FIG. 12, for example, depending on a configuration of the computing device 1300. Program Data 1324 includes values 1328 corresponding to Taylor series components of the sinusoid signal, for example. In some example embodiments, application 1322 can be arranged to operate with program data 1324 on the operating system 1320. This described basic configuration is illustrated in FIG. 13 by those components within dashed line 1302.

Computing device 1300 can have additional features or functionality, and additional interfaces to facilitate communications between the basic configuration 1302 and any required devices and interfaces. For example, a bus/interface controller 1330 can be used to facilitate communications between the basic configuration 1302 and one or more data storage devices 1332 via a storage interface bus 1334. The data storage devices 1332 can be removable storage devices 1336, non-removable storage devices 1338, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 1306, removable storage 1336 and non-removable storage 1338 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 1300. Any such computer storage media can be part of device 1300.

Computing device 1300 can also include an interface bus 1340 for facilitating communication from various interface devices (e.g., output interfaces, peripheral interfaces, and communication interfaces) to the basic configuration 1302 via the bus/interface controller 1330. Example output interfaces 1342 include a graphics processing unit 1344 and an audio processing unit 1346, which can be configured to communicate to various external devices such as a display or speakers via one or more A/V ports 1348. Example peripheral interfaces 1350 include a serial interface controller 1352 or a parallel interface controller 1354, which can be configured to communicate with external devices such as input devices (e.g., keyboard, mouse, pen, voice input device, touch input device, etc.) or other peripheral devices (e.g., printer, scanner, etc.) via one or more I/O ports 1356. An example communication interface 1358 includes a network controller 1360, which can be arranged to facilitate communications with one or more other computing devices 1362 over a network communication via one or more communication ports 1364. The communication connection is one example of a communication media. Communication media may typically be embodied by computer readable instructions, data structures, program modules, or other data in a modulated data signal, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. In some examples, the term computer readable media as used herein can include storage media, communication media, or both.

Computing device 1300, and/or portions of computing device, can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1300 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A system for outputting a signal, comprising:
    at least one memory element configured to store a value of a component in a Taylor series expansion;
    a parallel to serial converter configured to convert an output of the at least one memory element to a serial bitstream output for transmission;
    a serial to parallel converter configured to convert the serial bitstream output into a parallel bitstream output;
    an adder configured to combine the parallel bitstream output from the at least one memory element to form a signal output; and
    a digital-to-analog converter (DAC) configured to convert the signal output to an analog output signal.

2. The system of claim 1, further comprising a low pass filter configured to filter the analog output signal.

3. The system of claim 1, wherein the one or more memory elements include read-only-memories (ROMs).

4. The system of claim 1, further comprising an output register configured to:
    receive components of the Taylor series expansion from the adder, and
    pass the components of the Taylor series expansion to the DAC.

5. The system of claim 1, further comprising a register configured to couple to the at least one memory element to buffer outputs of the at least one memory element to provide the outputs to the adder at substantially the same time.

6. The system of claim 1, further comprising a phase accumulator configured to generate digital waveforms by incrementing a phase counter based on an external clock frequency.

7. The system of claim 6, wherein the phase accumulator is further configured to output the digital waveforms in binary form to the at least one memory element.

8. The system of claim 7,
    wherein the digital waveforms are divided into upper bits and lower bits, and wherein a value of the upper bits (u) and a value of the lower bits (p-u) are used as addresses to look up phase values in the at least one memory element.

9. The system of claim 1, wherein an output of the adder includes:

$$\sin\left(\frac{\pi}{2}u\right) + \frac{1}{4}k_1\left((P-u) + \cos\left(\frac{\pi}{2}u\right)\right)^2 - \frac{1}{4}k_1\left((P-u) - \cos\left(\frac{\pi}{2}u\right)\right)^2 - \frac{1}{2}k_2(P-u)^2\sin\left(\frac{\pi}{2}u\right),$$

wherein $k_1$ and $k_2$ are constants.

10. The system of claim 1, wherein the at least one memory element is further configured to store values including:

$$\sin\left(\frac{\pi}{2}u\right),$$

$$\frac{1}{4}k_1\left((P-u) + \cos\left(\frac{\pi}{2}u\right)\right)^2,$$

$$\frac{1}{4}k_1\left((P-u) - \cos\left(\frac{\pi}{2}u\right)\right)^2, \text{ and}$$

$$-\frac{1}{2}k_2(P-u)^2\sin\left(\frac{\pi}{2}u\right),$$

wherein $k_1$ and $k_2$ are constants.

11. A system for outputting a signal, comprising:
at least one memory element configured to store a value of a component in a Taylor series expansion;
a parallel to serial converter configured to convert an output of the at least one memory element to a serial bitstream output for transmission;
a serial to parallel converter configured to convert the serial bitstream output into a parallel bitstream output; and
an adder configured to combine the parallel bitstream output from the at least one memory element to form a signal output, wherein the adder includes a compressor that receives the output from the at least one memory element and performs a bitwise addition of the output of the at least one memory element.

12. The system of claim 1, wherein the at least one memory element includes different sizes, wherein the at least one memory element that includes a fine resolution size are configured to receive a clock inactive signal to operate in a low power mode.

13. The system of claim 1, wherein the DAC includes a first order hold interpolation (FOHI) DAC including a current analog output signal dependent upon a previous sample of a digital input signal and a current digital input sample.

14. The system of claim 1, wherein the at least one memory element is located on a first active layer of an integrated circuit and the adder is located on a second active layer of the integrated circuit different from the first layer, wherein the first active layer and the second active layer are connected using through-silicon vias (TSVs).

15. The system of claim 14, wherein the parallel to serial converter is located on the first integrated circuit and the serial to parallel converter is located on the second integrated circuit.

16. A method of generating an output signal, comprising:
receiving most significant bits and least significant bits as inputs at one or more memory elements;
using the most significant bits and the least significant bits as memory address locations to retrieve from the one or more memory elements a value of a component in a Taylor series expansion;
converting an output of the one or more memory elements to a serial bitstream output for transmission;
converting the serial bitstream output into a parallel bitstream output for processing; and
combining the parallel bitstream output from the one or more memory elements to form a signal output.

17. The method of claim 16, further comprising converting the signal output to an analog output signal.

18. The method of claim 17, further comprising low pass filtering the analog output signal.

19. The method of claim 16, further comprising buffering outputs of the one or more memory elements to provide the outputs to an adder at substantially the same time.

* * * * *

UNITED STATES PATENT AND TRADEMARK OFFICE
CERTIFICATE OF CORRECTION

PATENT NO. : 9,100,044 B2
APPLICATION NO. : 14/054370
DATED : August 4, 2015
INVENTOR(S) : Mazumdar et al.

It is certified that error appears in the above-identified patent and that said Letters Patent is hereby corrected as shown below:

Specification

In Column 6, Line 57, delete "details embodiment" and insert -- details an embodiment --, therefor.

In Column 6, Line 59, delete "forms or" and insert -- forms of a --, therefor.

In Column 7, Line 23, delete "an $K_2$" and insert -- and $K_2$ --, therefor.

Signed and Sealed this
Twenty-ninth Day of March, 2016

Michelle K. Lee
*Director of the United States Patent and Trademark Office*